US012805061B2

(12) United States Patent
Chen et al.

(10) Patent No.: US 12,805,061 B2
(45) Date of Patent: Nov. 17, 2026

(54) PHOTODIODE DETECTOR AND METHOD OF FABRICATING THE SAME

(71) Applicant: Nanyang Technological University, Singapore (SG)

(72) Inventors: Qimiao Chen, Singapore (SG); Chuan Seng Tan, Singapore (SG); Lin Zhang, Singapore (SG); Shaoteng Wu, Singapore (SG)

(73) Assignee: Nanyang Technological University, Singapore (SG)

( * ) Notice: Subject to any disclaimer, the term of this patent is extended or adjusted under 35 U.S.C. 154(b) by 673 days.

(21) Appl. No.: 18/249,854

(22) PCT Filed: Oct. 21, 2021

(86) PCT No.: PCT/SG2021/050635
§ 371 (c)(1),
(2) Date: Apr. 20, 2023

(87) PCT Pub. No.: WO2022/093113
PCT Pub. Date: May 5, 2022

(65) Prior Publication Data
US 2023/0387335 A1 Nov. 30, 2023

(30) Foreign Application Priority Data
Oct. 28, 2020 (SG) ........................... 10202010685X

(51) Int. Cl.
*H10F 77/40* (2025.01)
*H10F 30/223* (2025.01)
*H10F 71/00* (2025.01)

(52) U.S. Cl.
CPC ....... *H10F 77/413* (2025.01); *H10F 30/2235* (2025.01); *H10F 71/1215* (2025.01)

(58) Field of Classification Search
CPC ............... H10F 77/413; H10F 77/1226; H10F 30/2235; H10F 30/225; H10F 71/1215; H10F 71/1035; H10F 71/1395
See application file for complete search history.

(56) References Cited

U.S. PATENT DOCUMENTS

| | | | | |
|---|---|---|---|---|
| 5,315,128 A * | 5/1994 | Hunt | H10F 30/223 257/17 |
| 11,418,006 B1 * | 8/2022 | Laflaquière | H01S 5/0261 |

(Continued)

FOREIGN PATENT DOCUMENTS

| | | | | |
|---|---|---|---|---|
| CN | 104022181 A * | 9/2014 | H10F 77/306 |

OTHER PUBLICATIONS

M. Ghioni et. al, "Resonant-Cavity-Enhanced Single-Photon Avalanche Diodes on Reflecting Silicon Substrates," in IEEE Photonics Technology Letters, vol. 20, No. 6, pp. 413-415, Mar. 15, 2008, doi: 10.1109/LPT.2008.916926. (Year: 2008).*

(Continued)

*Primary Examiner* — Sitaramarao S Yechuri
(74) *Attorney, Agent, or Firm* — Troutman Pepper Locke LLP

(57) ABSTRACT

According to embodiments of the present invention, a photodiode detector is provided. The photodiode detector includes an optical cavity including an overlying light-receiving portion and an underlying minor; and a GeSn absorption layer. The GeSn absorption layer may be disposed within the optical cavity and arranged between the overlying light-receiving portion and the underlying mirror. The overlying light-receiving portion may be configured to receive light to be detected by the photodiode detector. According to further embodiments of the present invention, a method of fabricating a photodiode detector is also provided.

19 Claims, 19 Drawing Sheets

(56) References Cited

U.S. PATENT DOCUMENTS

| | | | | |
|---|---|---|---|---|
| 2012/0025212 | A1* | 2/2012 | Kouvetakis | H10F 30/225 257/85 |
| 2013/0313579 | A1* | 11/2013 | Kouvetakis | H10D 62/81 420/556 |
| 2015/0214425 | A1* | 7/2015 | Taylor | H01S 5/3054 257/14 |
| 2017/0345958 | A1* | 11/2017 | Meyer | H10F 77/306 |
| 2020/0035843 | A1* | 1/2020 | Zhao | H10F 77/146 |
| 2021/0141060 | A1* | 5/2021 | Akselrod | G01S 7/486 |

OTHER PUBLICATIONS

Chen-Hsun Tsai et al., GeSn resonant-cavity-enhanced photodetectors for efficient photodetection at the 2 μm wavelength band. Optics Letters, Mar. 11, 2020, vol. 45, No. 6, pp. 1463 [Retrieved on Jan. 12, 2022] <DOI: 10.1364/OL.381960> Whole document.

Hao Zhou et al., High-efficiency GeSn/Ge multiple-quantum-well photodetectors with photon-trapping microstructures operating at 2 μm. Optics Express, Mar. 24, 2020, vol. 28, No. 7, pp. 10280 [Retrieved on Jan. 12, 2022] <DOI: 10.1364/OL.389378> Whole document.

Soumava Ghosh et al., Design and Analysis of GeSn-Based Resonant-Cavity-Enhanced Photodetectors for Optical Communications Applications. IEEE Sensors Journal, Jul. 15, 2020, vol. 20, No. 14, pp. 7801-7809 [Retrieved on Jan. 12, 2022] <DOI: 10.1109/JSEN.2020.2981416> Whole document.

Qimiao Chen et al., Investigation of resonant-cavity-enhanced GeSn photodetectors in short-wavelength infared regime. 2019 IEEE 16th International Conference on Group IV Photonics (GFP), Aug. 30, 2019, pp. 1-2 [Retrieved on Jan. 12, 2022] <DOI: 10.1109/GROUP4.2019.8925859> Whole document.

Bo-Jun Huang et al., GeSn resonant-cavity-enhanced photodetectors on silicon-on-insulator platforms. Optics Letters, Mar. 5, 2018, vol. 43, No. 6, pp. 1215 [Retrieved on Jan. 12, 2022] <DOI: 10.1364/OL.43.001215> Whole document.

Qimiao Chen et al., GeSn-on-insulator dual-waveband resonant-cavity-enhanced photodetectors at the 2um and 1.55 μm optical communication bands. Optics Letters, Jul. 30, 2021, vol. 46, No. 15, pp. 3809 [Retrieved on Jan. 12, 2022] <DOI: 10.1364/OL.43044> Whole document.

Qimiao Chen et al., Simulation of High-Efficiency Resonant-Cavity-Enhanced GeSn Single-Photon Avalanche Photodiodes for Sensing and Optical Quantum Applications. IEEE Sensors Journal, Jul. 1, 2021, vol. 21, No. 13, pp. 14789-14798 [Retrieved on Jan. 12, 2022] <DOI: 10.1109/JSEN.2021.3074407> Whole document.

International Search Report mailed Jan. 17, 2022 for International Patent Application No. PCT/SG2021/050635, which was filed Oct. 21, 2021 and published as WO/2022/093113 on May 5, 2022 (Applicant: Nanyang Technological University // Inventor: Chen, et al. // (3 pages).

Written Opinion mailed Jan. 17, 2022 for International Patent Application No. PCT/SG2021/050635, which was filed Oct. 21, 2021 and published as WO/2022/093113 on May 5, 2022 (Applicant: Nanyang Technological University // Inventor: Chen, et al.) (7 pages).

* cited by examiner

301

321

341

361

721

801

1041

1101

1121

1201

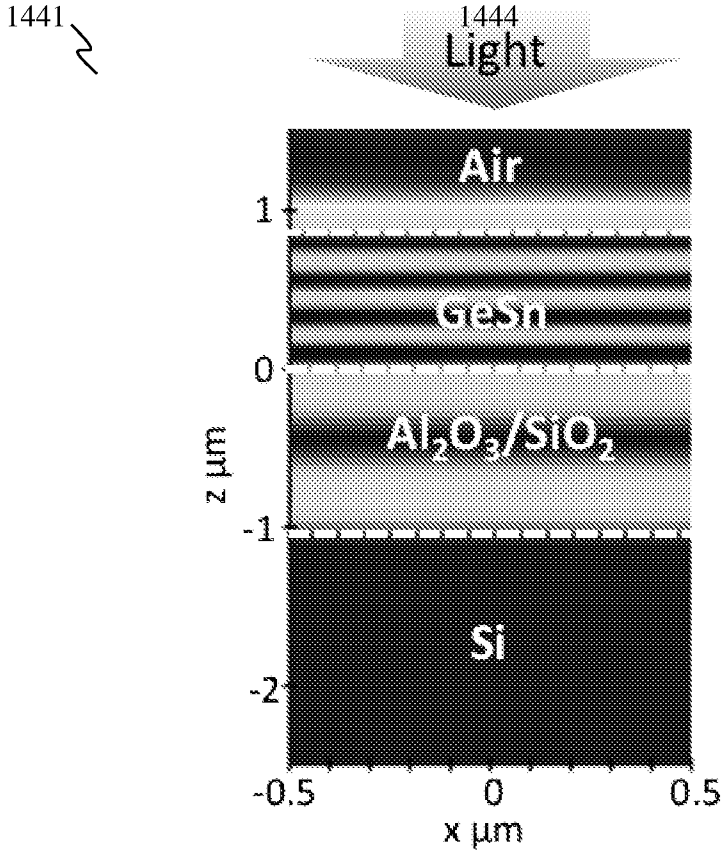
FIG. 14C
FIG. 15A
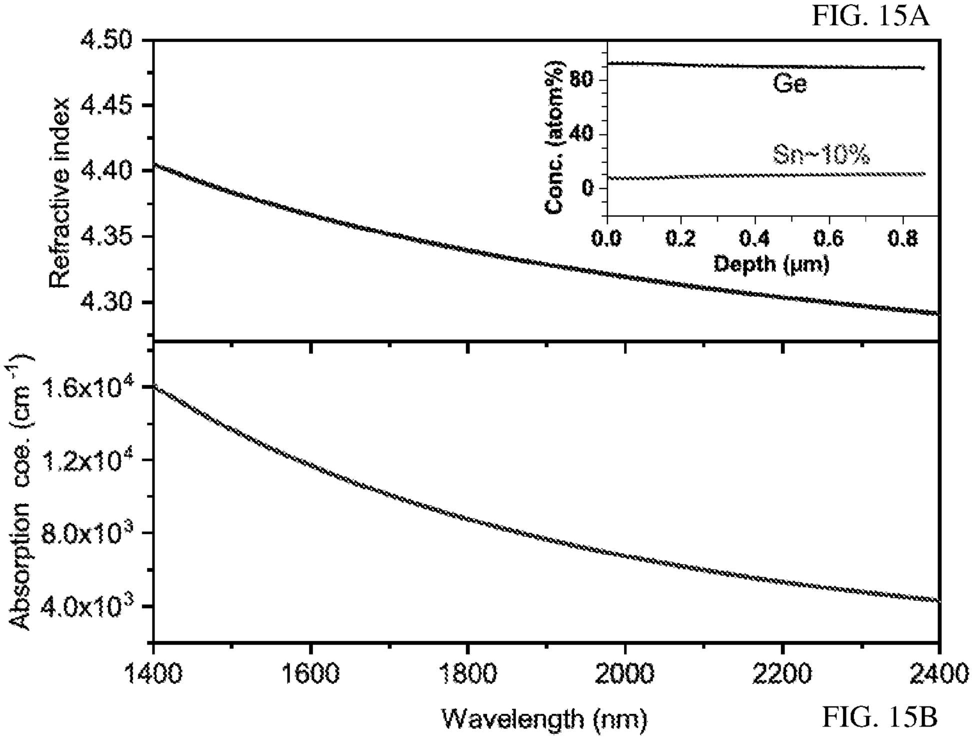
FIG. 15B

1601

1621

PHOTODIODE DETECTOR AND METHOD OF FABRICATING THE SAME

CROSS-REFERENCE TO RELATED APPLICATIONS

This application is a National Stage Application of International Application No. PCT/SG2021/050635, filed Oct. 21, 2021, which claims the benefit of priority of Singapore patent application No. 10202010685X, filed 28 Oct. 2020, all of which are herein incorporated by reference in their entireties.

TECHNICAL FIELD

Various embodiments relate to a photodiode detector and a method of fabricating the photodiode detector.

BACKGROUND

Photonic quantum information science has explosively developed over the last few decades due to its promising applications in quantum computing and quantum communication as well as fundamental science investigations. In general, photonic quantum information science involves the encoding, communication, manipulation and detection of information using photonic qubits, which are represented by the quantum state of the photon, such as polarization, momentum and energy.

A single-photon detector (SPD), which has the capability of single-photon detection, has been widely used during the past two decades in numerous applications such as quantum communication, quantum computing, Light Detection And Ranging (LIDAR) and fluorescence medical imaging. The SPD is also a key component to enable photonic quantum information system. At present, there are several SPDs available, including photomultiplier tubes, superconducting SPDs and semiconductor single-photon avalanche diodes (SPADs). Photomultiplier tubes have large active areas, but they suffer from low single-photon detection efficiency (SPDE) and high dark count rate (DCR).

Superconducting SPDs can provide high SPDE as well as low DCR. However, the extremely low operating temperature (cryogenic temperature, typically below 4 K) of the superconducting SPDs limits their practical applications. Currently, SPAD is a more practical approach for single-photon detections, which are reverse biased above the breakdown voltage (Geiger mode), resulting in a self-sustaining avalanche that enables responses to the absorption of even a single photon.

For wavelength below 1000 nm, Si (Silicon) SPADs have demonstrated excellent performance and been used in a wide range of quantum photonic and sensing applications. However, there exists a strong demand for extending the spectral range into short-wave infrared (SWIR, typically defined as the wavelength range of 1100-2500 nm), which is beyond the detection coverage of Si SPAD. Firstly, the 1550 nm wavelength is the optical fibre telecommunications window and SPADs at 1550 nm would benefit numerous fibre-based applications. In other words, the compatibility with the 1550 nm optical fibre low-loss telecommunications window provides a fundamental advantage in many fibre-based applications.

Furthermore, the 2000 nm low-loss hollow-core photonic band gap (HC-PBG) fibre window is considered as a promising candidate for the next generation of communication, especially since the conventional single-mode-fibers-based telecommunication system is approaching its theoretical capacity limit and may not meet the rapidly rising demands of Internet in the future. The compatibility with the 2000 nm window is expected to be strategic for future applications. The air core of HC-PBGFs reduces the Rayleigh scattering effect, resulting in a potential minimal loss of <0.1 dB/km which is lower than conventional single-mode fibers. Other advantages, such as high radiation hardness and low thermal sensitivity, allow for HC-PBGFs-based 2000 nm band to extend the conventional telecommunication system. Besides, thulium-doped fiber amplifiers demonstrated low noise and high gain at 2000 nm band, which may serve as light sources for the 2000 nm communication systems. Therefore, relentless efforts have been made to develop components for the 2000 nm communication systems. In addition, it is preferred that the communication systems can be developed by complementary-metal-oxide-semiconductor (CMOS) compatible processes to share the benefits of Si technologies in terms of electronic-photonic integration, scaling and low cost.

Secondly, in free-space applications such as LIDAR, the eye-safety thresholds for SWIR are higher than that of visible and near infrared (NIR) region. SWIR bands also are less affected by the atmospheric attenuation than the visible and NIR region. In other words, the atmospheric attenuation of SWIR bands is lower than that of the visible and NIR bands.

Finally, solar radiation, which typically acts as the undesirable background noise in most single-photon LIDAR systems, decreases considerably in the SWIR regime.

In the SWIR regime, the development of a high-performance SPAD, however, remains a challenge. Indium gallium arsenide/indium phosphide (InGaAs/InP) SPAD detectors are commonly used in the SWIR regime with detection wavelengths up to 1600 nm and operating temperature between 220 and 255 K. However, the group III-V SPAD detectors are incompatible with existing Si CMOS processing and make them expensive for mass-market applications. Besides, the after pulsing effect, where carriers trapped during the avalanche events or defect levels are emitted after the detection to trigger further avalanches, also limits the count rates of the SPADs. Alternatively, group IV material, germanium (Ge), is a candidate that is able to cover detection wavelengths up to 1600 nm at room temperature and is CMOS compatible. Several Ge-on-Si (or Ge/Si or GeSi) SPAD structures have been demonstrated, including normal incidence mesa geometry Ge-on-Si SPADs, waveguide Ge-on-Si SPADs and planar Ge-on-Si SPADs. The waveguide Ge-on-Si SPAD demonstrated an SPDE of 5.27% at a wavelength of 1310 nm with an operating temperature of 80 K. The state-of-the-art Ge SPAD is the planar Ge-on-Si SPADs, demonstrating an SPDE of 38% and a noise-equivalent power (NEP) of $2\times10^{-16}$ $WHz^{-1/2}$ at 125 K at a wavelength of 1310 nm, which compares more favorably with commercial InGaAs/InP SPADs. Although promising, Ge-on-Si SPADs suffer from some challenges. Firstly, the absorption coefficient of Ge at 1550 nm operating wavelength is low and insufficient for absorbing photons. For the demonstrated Ge SPAD, detection wavelength cutoff even reduced below 1550 nm at low temperature due to the enlarged bandgap by the decreased operating temperature. Besides, due to the low absorption coefficient, the thickness of Ge absorbers has to be greater than 1 μm so as to achieve an efficient absorption. However, the thick Ge increases the noise (DCR) and decrease the photon timing performance (jittering time). Therefore, it is more desirable to enhance the sensitivity of SPAD without increasing the absorption layer thickness, in other words, with a sufficiently thin absorption layer. Secondly, Ge hardly covers the wavelength beyond 1600 nm.

Photodetectors (PDs) operated at 2000 nm, which are compatible with Si technologies, are key components to enable 2000 nm band communication systems. However, as discussed above, it is challenging for GeSi systems to realize the photodetection in 2000 nm band due to large bandgap.

Germanium tin (GeSn), a CMOS-compatible group-IV semiconductor, whose bandgap energy is narrower than Ge, is capable of covering the 2000 nm band, essentially the wavelength detection in the entire SWIR regime. It has been shown that fully relaxed (fully strained) GeSn active layer with an Sn content of about 6% (about 8%) covers the wavelength beyond the 2000 nm wavelength band. Utilizing GeSn as active layers, various PDs, including p-i-n photodiodes, waveguide PDs, avalanche PDs, and photo-trapping-structure PDs, have been demonstrated with a photodetection range from 1500 to 4600 nm. A 3 dB bandwidth >10 GHz at 2000 nm has been achieved, showing the promise of GeSn for photodetection applications at the 2000 nm band and, in effect, light detection in the SWIR regime. However, the responsivity of GeSn-base PDs is still not satisfied. GeSn-on-insulator (GSOI) platforms have drawn increasing attention for advanced CMOS-compatible 3D photonic-integrated circuits for electronic and photonic applications. Compared to GeSn/Ge/Si structures, the quality of the GeSn layer of GSOI may be improved by removing the detective regions near GeSn/Ge and Ge/Si interfaces, resulting in a reduction in the dark current of PDs, threshold of lasers and enhancement in operation temperature of lasers. Besides this, the insulator layers underneath the GeSn layer confine the light in the absorbing layer better and improve the optical absorption/response of the PDs. So far, there have not been many reports in the literature on GeSn based PDs on GSOI platforms.

For example, a publication WO 2010/033641 A1 discloses photodiode devices with GeSn active layer integrated directly on p+ Si platforms under CMOS-compatible conditions, while another publication WO 2019/137620 A1 discloses a SWIR detector having an absorber layer including a GeSn or SiGeSn alloy composition. These publications involve the use of GeSn layer in absence of any enhancement, for example, absence of a resonant cavity.

To the best of the inventors' knowledge, GeSn SPADs for single-photon detections have not been demonstrated. Thus, there is a need for an improved and enhanced GeSn-based photodiode detector that is capable of at least addressing the challenges mentioned above.

SUMMARY

According to an embodiment, a photodiode detector is provided. The photodiode detector may include an optical cavity including an overlying light-receiving portion and an underlying mirror; and a GeSn absorption layer; wherein the GeSn absorption layer is disposed within the optical cavity and arranged between the overlying light-receiving portion and the underlying mirror, and the overlying light-receiving portion is configured to receive light to be detected by the photodiode detector.

According to an embodiment, a method of fabricating a photodiode detector is provided. The method may include forming a first wafer including an underlying mirror; forming a GeSn absorption layer over the first wafer; and forming an overlying light-receiving portion over the GeSn absorption layer.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which:

FIG. 14C shows a schematic diagram illustrating simulated electric field magnitude profile in the GSOI dual-waveband RCE PD with a 900 nm thick GeSn layer under a wavelength of 2000 nm illumination, according to one example.

FIG. 15A shows a graph illustrating a relationship between refractive index of GeSn layer on insulator measured by spectral ellipsometry, according to one example, with an inset being Sn and Ge atoms profile in the GeSn layer.

FIG. 15B shows a graph illustrating a relationship between absorption coefficient of GeSn layer on insulator measured by spectral ellipsometry, according to one example.

DETAILED DESCRIPTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles “a”, “an” and “the” as used with regard to a feature or element include a reference to one or more of the features or elements.

In the context of various embodiments, the phrase “at least substantially” may include “exactly” and a reasonable variance.

In the context of various embodiments, the term “about” or “approximately” as applied to a numeric value encompasses the exact value and a reasonable variance.

As used herein, the term “and/or” includes any and all combinations of one or more of the associated listed items.

As used herein, the phrase of the form of “at least one of A or B” may include A or B or both A and B. Correspondingly, the phrase of the form of “at least one of A or B or C”, or including further listed items, may include any and all combinations of one or more of the associated listed items.

As used herein, the expression “configured to” may mean “constructed to” or “arranged to”.

Various embodiments provide a CMOS-compatible resonant-cavity-enhanced (RCE) photodiode detector (PD) with resonance-enhanced responsivity and high-efficiency detection at 1550 nm wavelength and 2000 nm wavelength at room temperature. The RCE PD may be used for optoelectronic applications in 2000 nm and telecommunication bands. In one embodiment, the RCE PD may include a RCE germanium tin (GeSn) single-photon avalanche photodiode (SPAD) detector for sensing and quantum photonic applications.

Figure 1A:
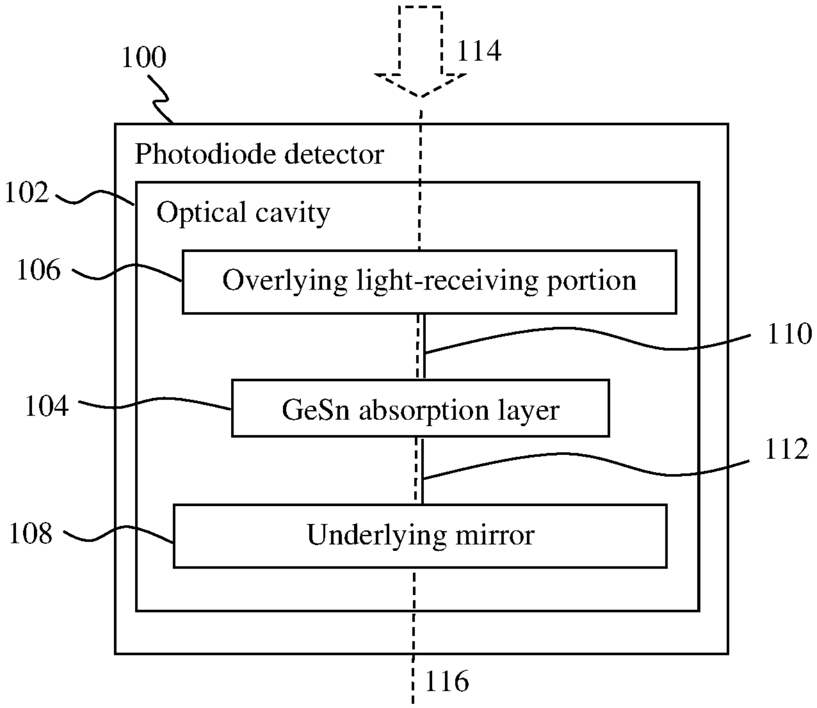
FIG. 1A shows a schematic cross-sectional view of a photodiode detector, according to various embodiments.

FIG. 1A shows a schematic cross-sectional view of a photodiode detector 100, in accordance with various embodiments. In FIG. 1A, the photodiode detector 100 includes an optical cavity 102, and a GeSn absorption layer 104. The optical cavity 102 may include an overlying light-receiving portion 106 and an underlying mirror 108. The GeSn absorption layer 104 may be disposed within the optical cavity 102 and arranged between the overlying light-receiving portion 106 and the underlying mirror 108. The overlying light-receiving portion 106 may be configured to receive light 114 to be detected by the photodiode detector 100. The overlying light-receiving portion 106 and the GeSn absorption layer 104 may form an interface 110. The GeSn absorption layer 104 and the underlying mirror 108 may form a different interface 112.

In other words, the photodiode detector 100 has the optical cavity 102 to sandwich the GeSn absorption layer 104. The underlying mirror 108 may be at or substantially near a base of the optical cavity 102. The GeSn absorption layer 104 may be arranged above or over the underlying mirror 108. The overlying light-receiving portion 106 may be arranged above or over the GeSn absorption layer 104. The overlying light-receiving portion 106 may be at or substantially near a top of the optical cavity 102, the top being opposite to the base, and light 114 to be detected by the photodiode detector 100 may be arranged to be received at the overlying light-receiving portion 106. The stacked arrangement within the optical cavity 102 allowing light 114 to be received along a longitudinal axis 116 of the optical cavity 102 provides the photodiode detector 100 with a vertical optical cavity that may enclose the GeSn absorption layer 104.

In the context of various embodiments, the photodiode detector 100 may interchangeably be referred to as a photodetector or a detector.

In one embodiment, the overlying light-receiving portion 106 may be a surface of the GeSn absorption layer 104, and the underlying mirror 108 may have a refractive index different from a refractive index of the GeSn absorption layer 104 surface. This underlying minor 108 may be or may include a semiconductor layer, or a dielectric layer. For example, the dielectric layer may be an aluminum oxide ($Al_2O_3$) layer.

In various embodiments, the photodiode detector 100 may further include a multiplier layer disposed adjacent to the GeSn absorption layer 104, wherein the photodiode detector 100 may be an avalanche photodiode detector. For example, the multiplier layer may include a Si multiplier layer. In these embodiments, the overlying light-receiving portion 106 and the GeSn absorption layer 104 may be arranged adjacent to each other, and the underlying minor 108 and the multiplier layer may be arranged adjacent to each other. An anode of the photodiode detector 100 may include a first metal contact for external electrical connection, the first metal contact overlying at least part of a positively doped p region of the GeSn absorption layer 104; and a cathode of the photodiode detector 100 may include a second metal contact for external electrical connection, the second metal contact overlying at least part of a negatively doped n region of the multiplier layer.

In one example, the underlying minor 108 may be a distributed Bragg reflector (DBR), and the overlying light-receiving portion 106 may include a passivation layer.

In another example, the underlying mirror 108 may be a first distributed Bragg reflector (DBR), and the overlying light-receiving portion 106 may be a second distributed Bragg reflector (DBR). The first DBR and the second DBR may include same or equal number of material pairs. In a different embodiment, the first DBR and the second DBR may include different numbers of material pairs. For example, the number of material pairs for the first DBR may be 2 or 3, while the number of material pairs for the second DBR may be 1.

The first DBR and the second DBR may include same type of material pairs. In a different embodiment, the first DBR and the second DBR may include different types of material pairs.

The DBR may be made of other material pairs as long as the material pair has refractive index contrast.

The DBR may be either a dielectric DBR or a semiconductor DBR. For example, amorphous Si (a-Si), oxide (silicon dioxide $SiO_2$, titanium dioxide $TiO_2$, tantalum oxide$Ta_2O_5$, amongst others.), nitride (silicon nitride SiN, amongst others) may be used for the dielectric DBR. For example, the type of material pairs may be silicon/silicon dioxide ($Si/SiO_2$) pairs. Meanwhile, silicon-germanium-tin/silicon-germanium-tin ($Si_{1-x-y}Ge_ySn_x/Si_{1-z-f}Ge_fSn_z$) pairs may be used as semiconductor DBR.

In various embodiments, the photodiode detector 100 may further include a substrate having a planar surface, wherein the optical cavity 102 may be arranged extending upwardly from the planar surface, with the underlying minor 108 being adjacent to the substrate or with the substrate forming an integrated part of the underlying minor 108.

In various embodiments, the GeSn absorption layer 104 may have a Sn content of near 0% to about 11%. For example, the GeSn absorption layer 104 may have the Sn content of about 3% to 4% to enhance absorption coefficient at a wavelength of 1550 nm, or about 10% to enhance absorption coefficient at a wavelength of 2000 nm.

In various embodiments, the GeSn absorption layer 104 may have a thickness of more than 100 nm. The thickness of the GeSn absorption layer 104 may depend on the growth technique, and this may be as thick as several micrometers.

The underlying minor 108 may have a thickness sufficient to provide about 0.5 reflectivity or more at a wavelength of 1550 nm or 2000 nm.

Figure 1B:
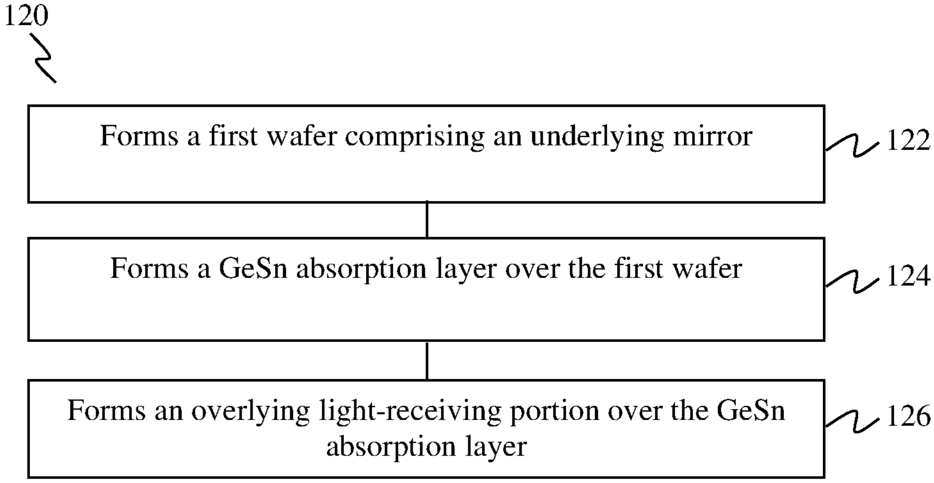
FIG. 1B shows a flow chart illustrating a method of fabricating a photodiode detector, according to various embodiments.

FIG. 1B shows a flow chart illustrating a method 120 of fabricating a photodiode detector in accordance with various embodiments. The photodiode detector may include the same or like elements or components as those of the photodiode detector 100 of FIG. 1A, and as such, the same numerals are assigned and the like elements may be as described in the context of the photodiode detector 100 of FIG. 1A, and therefore the corresponding descriptions are omitted here.

In FIG. 1B, at Step 122, a first wafer comprising an underlying minor (e.g. 108 of FIG. 1A) is formed. At Step 124, a GeSn absorption layer (e.g. 104 of FIG. 1A) over the first wafer is formed. At Step 126, an overlying light-receiving portion (e.g. 106 of FIG. 1A) over the GeSn absorption layer 104 is formed.

In various embodiments, the step of forming the GeSn absorption layer 104 over the first wafer at 124 may include forming a second wafer comprising the GeSn absorption layer 104, and wafer-bonding the first wafer and the second wafer. The GeSn absorption layer 104 on the second wafer may be facing toward the first wafer.

Prior to the step of wafer-bonding, the method 100 may further include atomic layer depositing a semiconductor material on the first wafer and the second wafer. The step of forming the second wafer may include depositing the GeSn absorption layer 104 over a temporary substrate. After wafer-bonding, the method 120 may further include removing the temporary substrate by grinding and/or wet etching, and chemical mechanical polishing the GeSn absorption layer 104. After chemical mechanical polishing the GeSn absorption layer 104, the overlying light-receiving layer 106 may be prepared via ion-implantation.

In other embodiments, the step of forming the GeSn absorption layer over the first wafer at 124 may include growing the GeSn absorption layer 104 and a p++ GeSn top contact layer over the first wafer using reduced pressure chemical vapour deposition. It is appreciated that the GeSn absorption layer 104 may be epitaxially grown on a Si layer or substrate using reduced pressure chemical vapour deposition.

In various embodiments, prior to the step of forming the GeSn absorption layer over the first wafer at 124, the method 100 may further include growing a multiplier layer over the underlying minor 108 using reduced pressure chemical vapour deposition. After growing the multiplier layer, the method 100 may include doping a charge sheet layer with ion implantation with boron acceptors; and performing rapid thermal annealing of the charge sheet layer and the multiplier layer.

Prior to the step of forming the first wafer at 122, the method 100 may further include fabricating the underlying minor 108 using a double-SOI (double-Silicon-On-Insulator) process.

After forming the overlying light-receiving portion 106 over the GeSn absorption layer 104 at 126, the method 100 may further include forming two metal contacts for external electrical connections of the photodiode detector 100 using a metal deposition process, or a process including photolithography, electron-beam deposition, and subsequent lift-off process. Prior to the step of forming the two metal contacts, a mesa may be patterned on at least portion of the photodiode detector 100.

While the method described above is illustrated and described as a series of steps or events, it will be appreciated that any ordering of such steps or events are not to be interpreted in a limiting sense. For example, some steps may occur in different orders and/or concurrently with other steps or events apart from those illustrated and/or described herein. In addition, not all illustrated steps may be required to implement one or more aspects or embodiments described herein. Also, one or more of the steps depicted herein may be carried out in one or more separate acts and/or phases.

Examples of photodiode detectors, more specifically, CMOS-compatible RCE PDs and methods of fabricating the same will be described below.

Design 1: Resonant-Cavity-Enhanced (RCE) Germanium-Tin (GeSn)-Based Single-Photon Avalanche Diodes (SPAD)

A novel structure of resonant-cavity-enhanced (RCE) GeSn-based SPAD may be provided to realize high-performance single-photon detection in the SWIR regime for quantum photonic and sensing applications. The structure of the SPAD is designed and the performance is predicted with the aid of Technology Computer Aided Design (TCAD) software. The RCE GeSn-based SPAD may include the same or like elements or components as those of the photodiode detector 100 of FIG. 1A, and as such, similar ending numerals may be assigned and the like elements may be as described in the context of the photodiode detector 100 of FIG. 1A, and therefore the corresponding descriptions are omitted here.

The GeSn-on-Si substrate is developed by reduced pressure chemical vapor deposition (RPCVD). Two fabrication approaches of the devices, including direct epitaxy and wafer bonding, are discussed. The fabrication approaches may be described in similar context to the method 100 of FIG. 1B. The high reflective DBR for constructing the optical cavity is fabricated and characterized.

A vertical optical cavity is introduced to sandwich the conventional separate absorption and carrier multiplication (SACM) structure of SPAD to advantageously enhance the absorption efficiency (approaching 100%) and thin the absorption layer as well, which makes the SPAD with high detection efficiency, low noise and high photon timing possible. In other words, the RCE GeSn-based SPAD may include a PIPIN GeSn/Si heterostructures embedded in the optical cavity formed by the DBR and GeSn surface. The RCE GeSn-based SPAD has other advantages and improvements over the state-of-the-art Ge-on-Si and InGaAs/InP SPADs in the application of SWIR regime, as follow:— i) High absorption coefficient (capable of achieving $>10000\ cm^{-1}$) at the wavelengths of 1550 nm and 2000 nm, resulting in high detection efficiency;
ii) Broad detection wavelength coverage up to 2500 nm;
iii) Compatibility with Si-CMOS technology and easy to be scaled down, leading to low costs of the devices.

Development of High-Quality GeSn on Si substrates

The GeSn on Si substrates are developed for the high-performance GeSn SPAD by an industry compatible tool of RPCVD systems. Materials considerations may include high absorption coefficient, low threading dislocation density(ies) (TDDs) and compatibility with CMOS processing. The growth, characterization and analysis of the structural and optical properties of GeSn materials are discussed.

The detection wavelength may be extended and the absorption coefficient of GeSn may be improved by increasing the Sn content in the GeSn film, thus increasing the SPDE of GeSn SPAD. The Ge buffer layer may be utilized to reduce the defects induced by the large lattice mismatch between GeSn and Si, thus confining most defects in the Ge/Si interface. Wafer bonding, post-annealing and graded GeSn buffers may be utilized to reduce the TDD of GeSn layers further. The fewer defects in GeSn result in the lower DCR of the GeSn SPAD.

In this example, the GeSn alloys is grown on 150 mm (100) Si substrates by an RPCVD system using digermanium ($Ge_2H_6$) and tin chloride ($SnCl_4$) as precursors. The growth process includes Ge buffer layer growth followed by GeSn epitaxial growth. The Ge is grown at 400° C. for about 10 min to target a thickness of 1 nm. The wafers are annealed soon after growth at about 850° C. for another 20 min in hydrogen ($H_2$) environment to reduce the TDD of the Ge buffer layer. Subsequently, $SnCl_4$ is introduced into the chamber, along with the $Ge_2H_6$ and carrier gas $H_2$. The chamber temperature is kept below 350° C. to avoid Sn segregation or precipitation. Then the structural properties of GeSn/Si substrates are characterized by transmission electron microscope (TEM), scanning electron microscope (SEM), secondary ion mass spectrometry (SIMS) and x-ray diffraction (XRD). The optical property is characterized by spectral ellipsometry (SE).

Figure 2A:
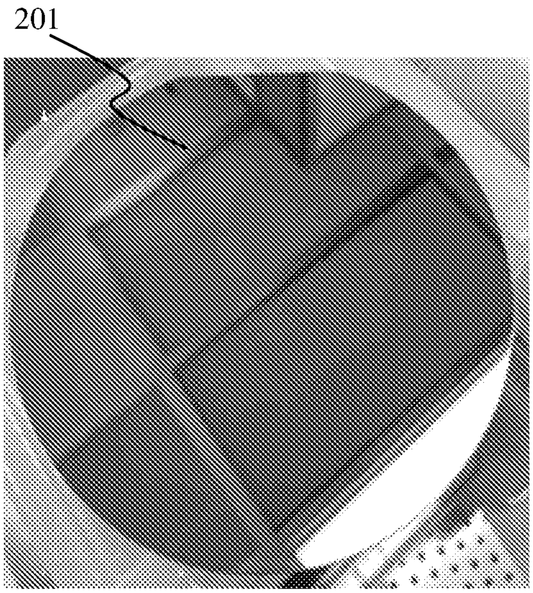
FIG. 2A shows a photo image of a 6-inch GeSn/Ge/Si wafer, according to one example.
Figure 2B:
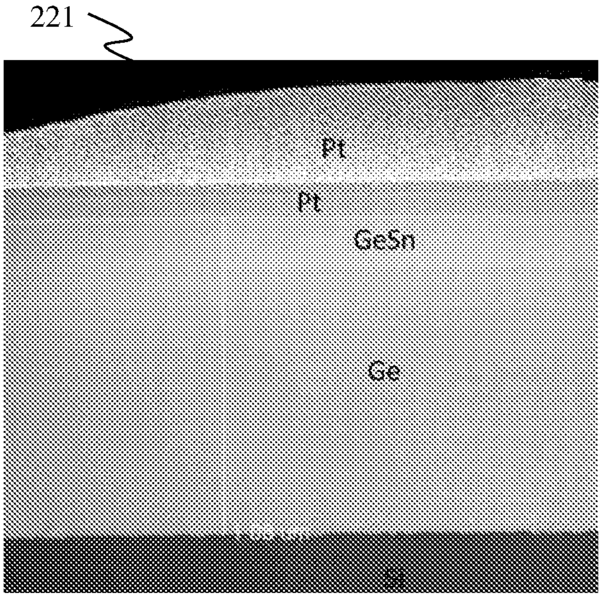
FIG. 2B shows a transmission electron microscope (TEM) image illustrating a cross-sectional view of the GeSn/Ge/Si wafer of FIG. 2A.
Figure 2C:
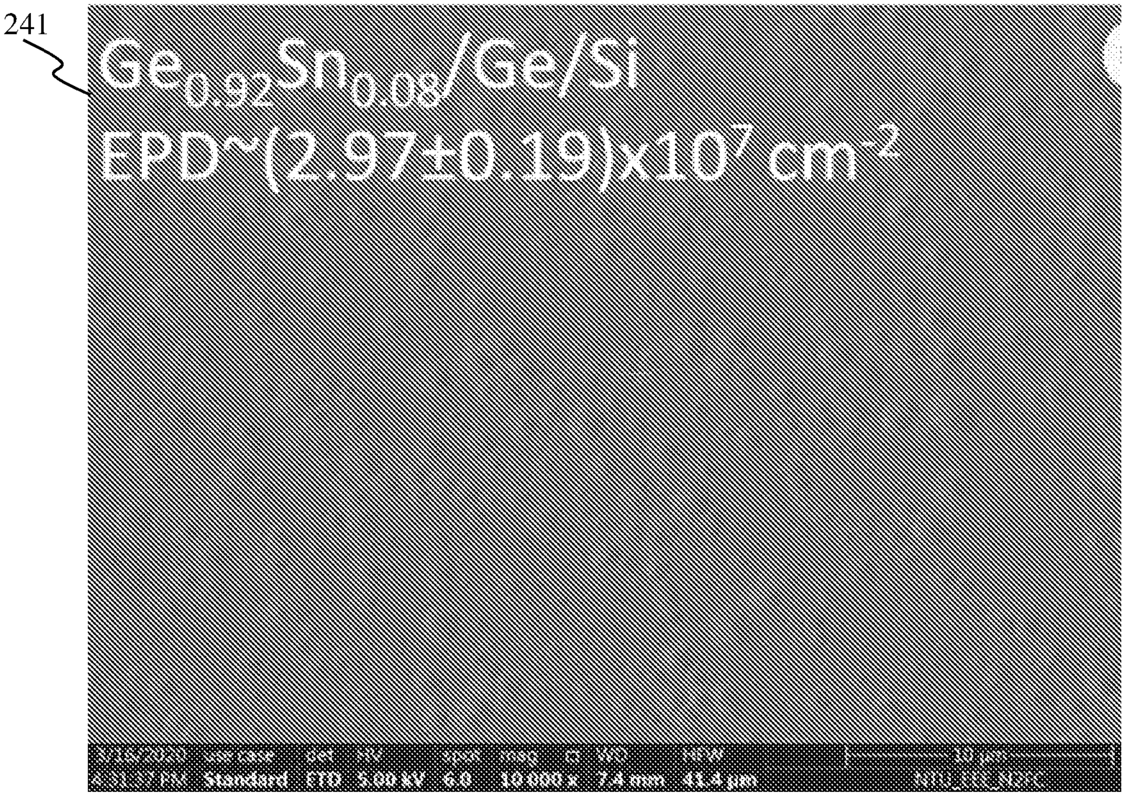
FIG. 2C shows a scanning electron microscope (SEM) image providing the threading dislocation density (TDD) and the etching pits density (EPD) of the GeSn/Ge/Si wafer of FIG. 2A.

FIG. 2A shows a photograph 201 of a 6-inch GeSn/Ge/Si wafer with a shiny surface, indicating the absence of Sn segregation. Most defects are confined in the Ge/Si interface and no obvious defects are observed in GeSn layer in TEM images (FIG. 2B showing a TEM image 221). The TDD of GeSn is estimated to be about $3\times10^{7}$ $cm^{-2}$ according to the etching pits density (EPD) based on the SEM image 241 (FIG. 2C). There is a need to further reduce the TDD of GeSn by post-annealing or wafer bonding techniques. According to the relationship of Shockley-Read-Hall (SRH) carrier lifetime versus TDD extracted from Ge photodiodes, the SRH carrier lifetime of the grown GeSn alloys is estimated to be about $2\times10^{-7}$ s, which is among the high values and benefits the DCR reduction (as shown in the graph 361 of FIG. 3D).

Figure 3A:
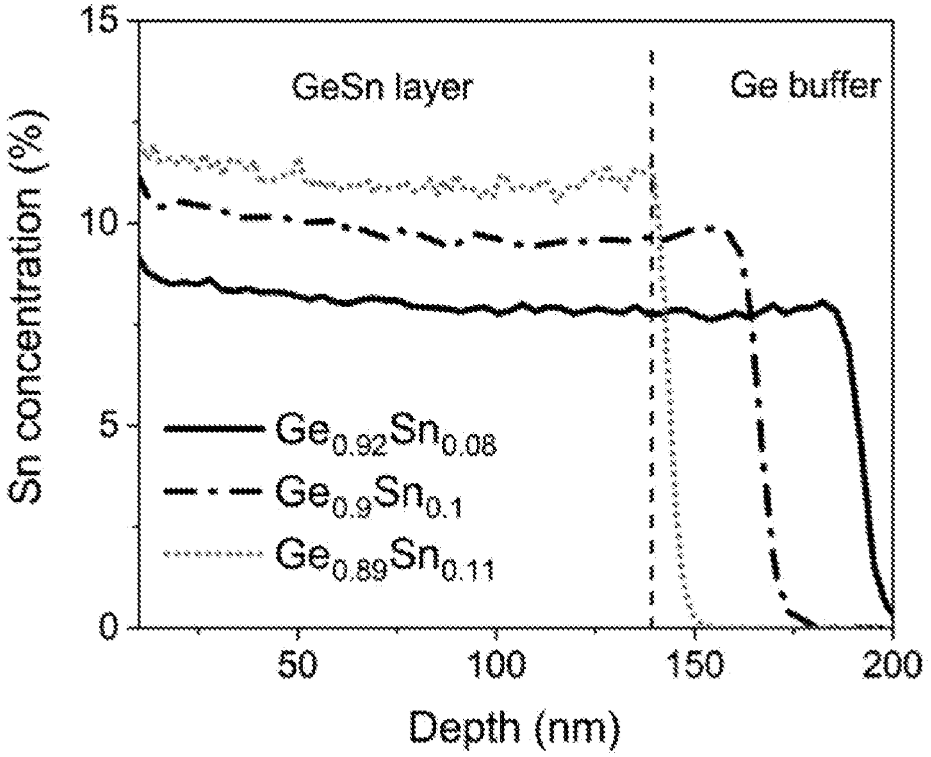
FIG. 3A shows a graph illustrating profiles of the Sn content or concentration of various GeSn samples at different depths measured by secondary ion mass spectrometry (SIMS).
Figure 3B:
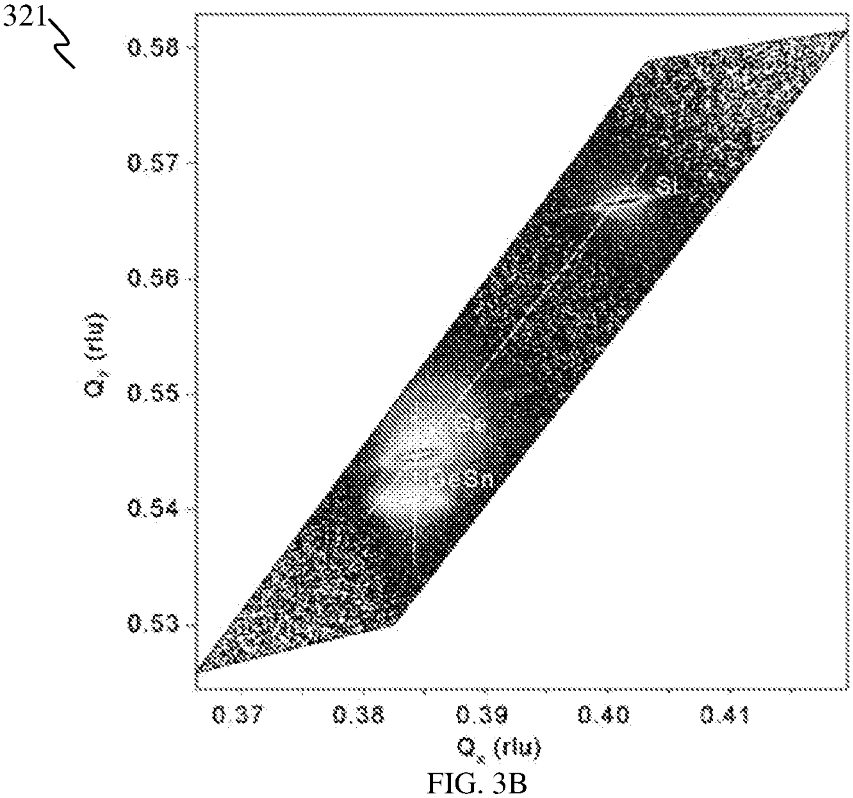
FIG. 3B shows a 224 x-ray diffraction (XRD) reciprocal space mapping (RSM) of a GeSn/Ge/Si sample, according to one example.
Figure 3C:
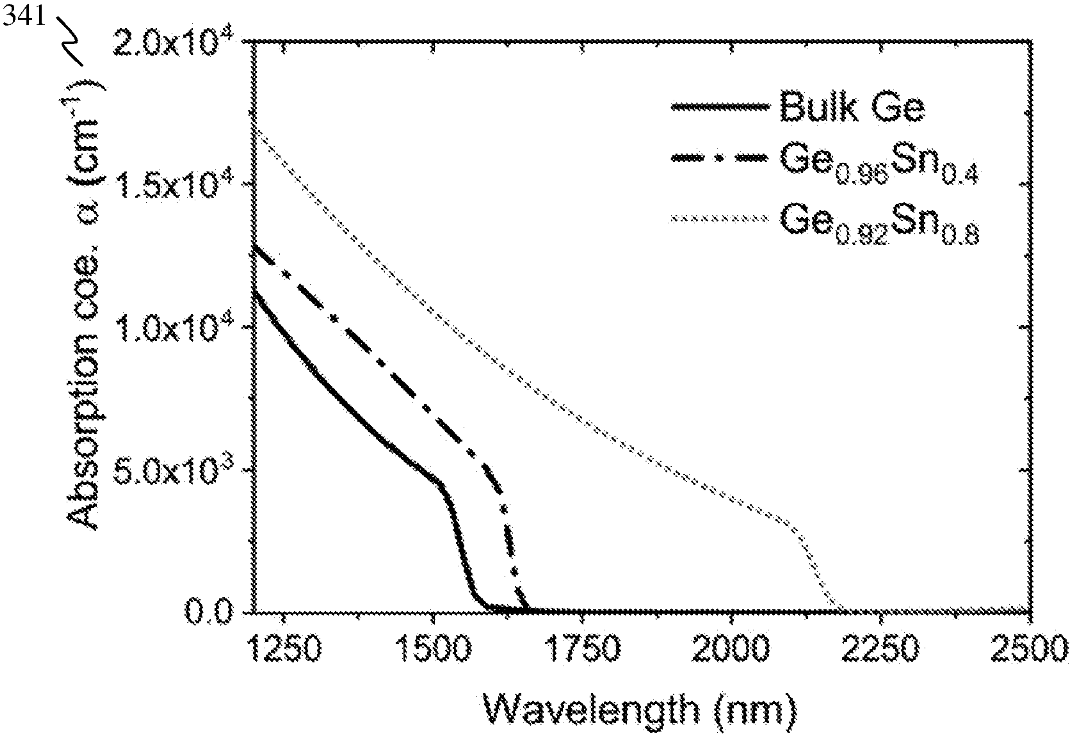
FIG. 3C shows a graph illustrating the absorption coefficient of various GeSn samples with various Sn content as well as bulk Ge measured by spectral ellipsometry (SE).
Figure 3D:
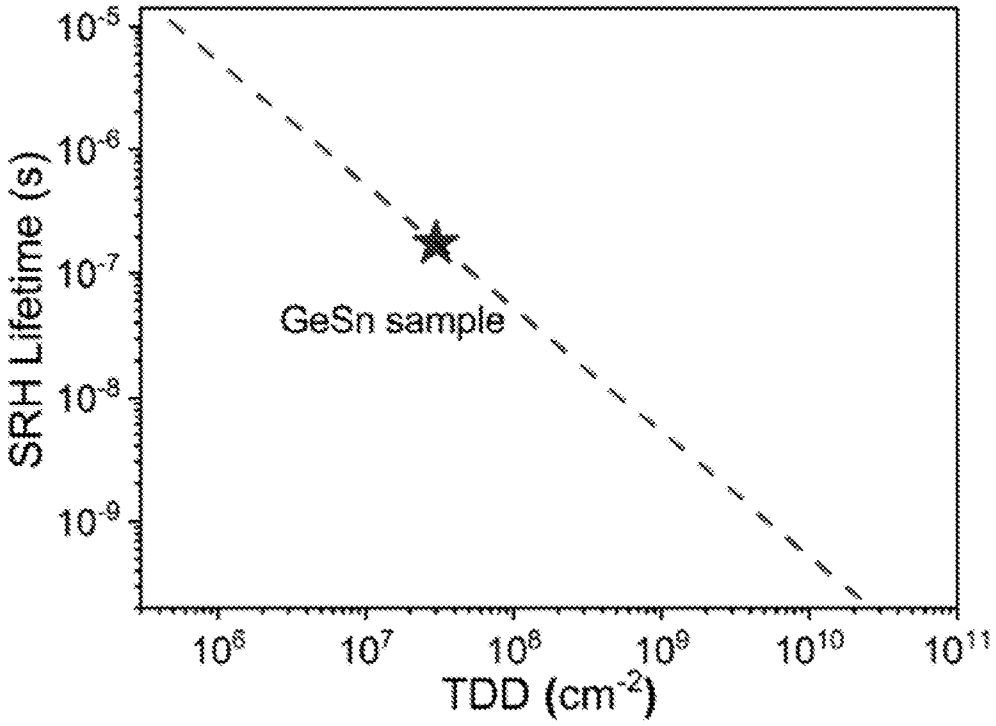
FIG. 3D shows a graph illustrating the estimated Shockley-Read-Hall (SRH) carrier lifetime of a GeSn sample (starred point) as a function of TDD extracted from Ge photodiodes (black dashed line), according to one example.

The Sn content of GeSn alloys may be tuned from 0 to 11% with some residual compressive strain (as shown in the graph 301 of FIG. 3A and the reciprocal space mapping 321 of FIG. 3B). Thus, the absorption coefficient may be extended beyond the wavelength of 2000 nm and the absorption coefficient may increase significantly at the specific wavelengths of 1550 nm and 2000 nm by increasing the Sn content (as shown in the graph 341 of FIG. 3C). Therefore, the optical property of the grown GeSn material may fulfill the requirement for the high-performance GeSn SPAD for SWIR detection.

Design, Modelling and Fabrication of RCE GeSn SPAD

Besides material properties, the performances of GeSn SPAD heavily depend on the design/structure of SPAD. The design of the RCE GeSn SPAD, prediction and optimization of the performance of RCE GeSn SPAD by modeling, and finally fabrication of the optimized RCE GeSn SPAD are discussed. The modeling is done with the aid of TCAD software Lumerical, COMSOL and Matlab.

To meet the objectives of high SPDE, low DCR and high operation temperature, several designs are explored. Firstly, selection is made to the separate absorption and carrier multiplication (SACM) structure which has been proved as an efficient approach to reduce the DCR by avoiding band-to-band tunneling in absorption layers. Photons are absorbed in GeSn layers and the photo-generated electrons drift into Si multiplication layer to trigger avalanche events. Secondly, the GeSn absorber and Si multiplier is sandwiched with a resonant cavity in which the photon absorption probability in the absorption layer is enhanced, thus increasing the SPDE. The Sn content of GeSn is tailored to achieve high absorption coefficients. In this example, about 3% to about 4% Sn content is chosen for the absorption at the wavelength of 1550 nm and 10% Sn is chosen for the absorption at 2000 nm Other design considerations are the electric field profile (high in Si multiplier and moderate in GeSn absorber), the carrier collection efficiency of the photogenerated carriers injected from the GeSn absorber to the Si multiplier, the thickness and doping concentration of charge sheet layer and TDD effect.

Figure 4:
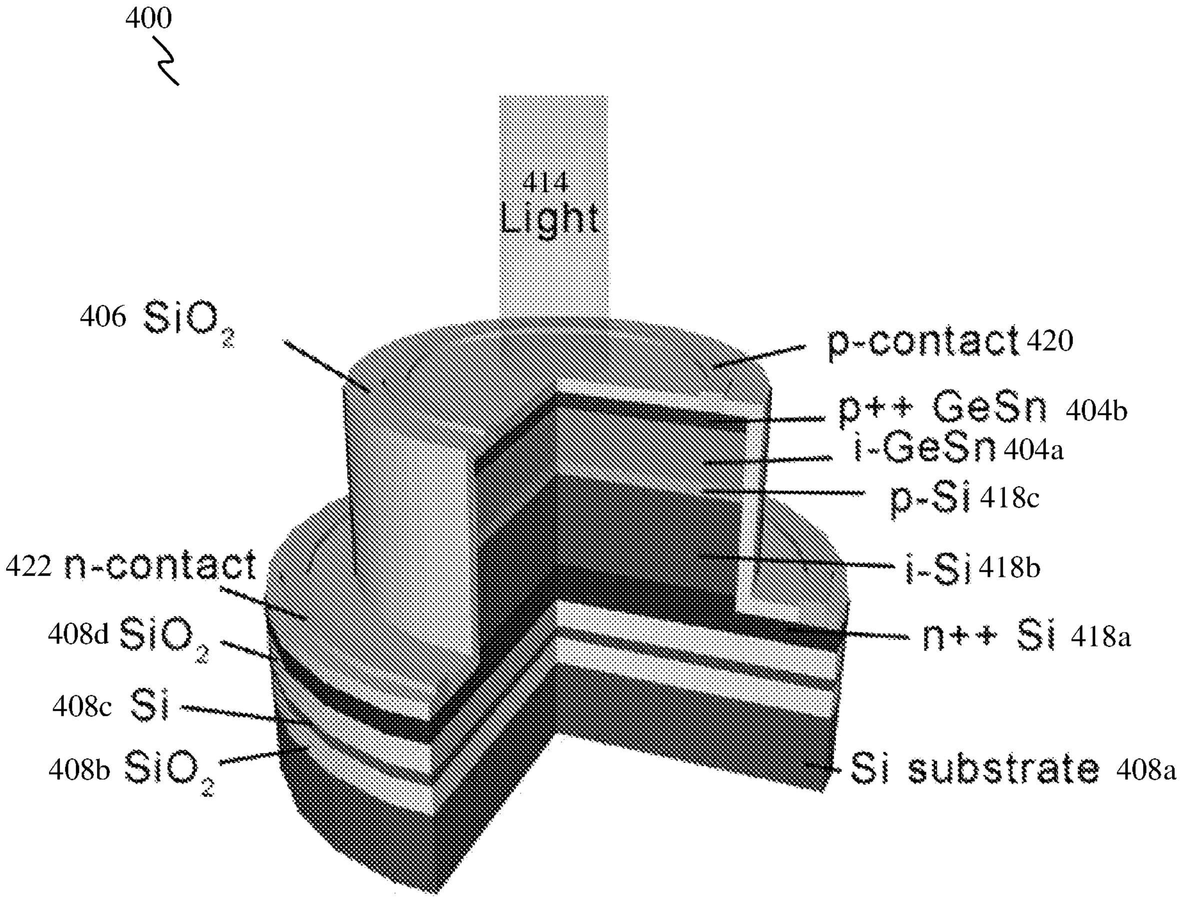
FIG. 4 shows a schematic perspective cut-off view of a resonant-cavity-enhanced (RCE) germanium-tin (GeSn)-based single-photon avalanche diode (SPAD) structure including a PIPIN GeSn/Si structure sandwiched by an optical cavity, according to one example.

A schematic of the architecture of the designed RCE GeSn SPAD 400 is shown in FIG. 4A. As seen in FIG. 4A, the SPAD 400 includes a (heavily p-doped) p++ GeSn 404*b*, (intrinsic) i-GeSn 404*a*, (p-doped) p-Si 418*c* (or Si charge layer), i-Si 418*b* and (heavily n-doped) n++ Si 418*a* heterostructures layers embedded in an optical cavity 406, 408*b-d* formed by a distributed Bragg reflector (DBR) 408*b-d* and air/GeSn interfaces. The air/GeSn interfaces may be apparent as the passivation $SiO_2$ layer 406 is significantly thin which in effect replaces the $SiO_2$/GeSn interfaces with air/GeSn interfaces. It should be noted that in other examples, the passivation $SiO_2$ layer 406 may be replaced with another DBR (not shown in FIG. 4) that may tune the detection efficiency of the SPAD further. The optical cavity 406, 408*b-d* may be formed over a Si substrate 408*a*. In one example, the Si substrate 408*a* may be an integrated part of the optical cavity. For example, the SPAD 400 may be described in similar context as the photodiode detector 100 of FIG. 1A, and thus the optical cavity 406, 408*b-d*, the passivation $SiO_2$ layer 406, the p++GeSn 404*b* along with i-GeSn 404*a*, the DBR 408*b-d* may be described in similar contexts as the optical cavity 102, the overlying light-receiving portion 106, the GeSn absorption layer 104, and the underlying mirror 108 of FIG. 1A, respectively. The SPADs may be grown on n++ doped silicon substrates 418*a* with a buried Si/$SiO_2$ DBR 408*b-d* fabricated by a commercially available repeated-SOI process. The GeSn absorption layer 104 may be epitaxially grown on Si charge layer or bonded on to Si charge layer from GeSn/Ge/Si donor wafers by layer transfer and bonding technique. The bonded GeSn is expected to have lower TDDs than that of direct epitaxial GeSn since the defective region may be removed after bonding.

A p-contact 420 for external electrical connection is provided on a portion of the passivation $SiO_2$ layer 406 overlying the p++ GeSn 404*b* layer, while a n-contact 422 also for external electrical connection is provided on another portion of the passivation $SiO_2$ layer 406 overlying the n++ Si 418*a* layer. The thickness of the DBR layers 408*b-d* is designed specifically to obtain a high reflectance at a wavelength of 1550 nm or 2000 nm. The thickness of GeSn 404*a*, 404*b* is designed to achieve high absorption efficiency. The doping concentration and thickness of the charge layer (p-Si layer) are optimized to obtain a proper electric field distribution in the SPAD 400 and a high device performance. The SPAD 400 may operate upon receiving light 414 through the passivation $SiO_2$ layer 406 in a substantially vertical direction, along a longitudinal axis of the SPAD 400.

A proper electric field distribution may refer to an electric field being high in Si multiplication layer (e.g. electric field strength, E>300 kV/cm) to achieve avalanche effect and moderate in Ge absorption layer (e.g. 100 kV/cm>E>30 kV/cm) to achieve saturated carrier drift velocity. High device performance may refer to high single photon detection efficiency (SPDE) and low dark count rates (DCR). Based on the requirement on the electric field distribution, the doping concentration and thickness of the charge layer may be decided by Poisson's equation: $dE/dz=\rho/\varepsilon$ where $\varepsilon$ is permittivity of the medium involved, p is a total volume charge density, and z is a spatial displacement. For example, if the thickness of the charge layer is chosen to be 100 nm, the doping concentration is about $1.7\times10^{17}$ $cm^{-3}$. If the thickness of the charge layer is chosen to be 50 nm, the doping concentration is about $3.4\times10^{17}$ $cm^{-3}$. Therefore, considering both device performance and fabrication technology, the thickness of the charge layer may be about 10 nm to about 100 nm and the doping concentration is about $1\times10^{17}$ $cm^{-3}$ to about $10\times10^{17}$ $cm^{-3}$.

In FIG. 4, the SPAD 400 is shown to have a circular horizontal cross-section and double-tiered with encircling contacts. It should be understood and appreciated that other examples of SPADs may have horizontal cross-sections of any shape, and/or different configuration or tiered design, and/or contacts of other form/shapes/dimensions. The contacts for external electrical connection may be closed (forming a ring) or unclosed (opened-ended). The contacts may be planar.

Method for Modeling of SPAD Performance

Theoretical models for the designed GeSn RCE-SPAD 400 are presented here. The modeling parameters include reflectivity of DBR, absorption efficiency, absorption coefficient, SPDE, DCRs and noise equivalent power (NEP). Most parameters of GeSn alloys are calculated by linear interpolation of parameters of Ge and a-Sn except bandgaps. The bandgaps of unstrained GeSn alloy are described by quadratic polynomials including bowing parameters ($b_\Gamma$=2.18 eV and $b_L$=0.68 eV). The wavelength and composition-dependent refractive index of GeSn are obtained from the reference (H. Tran et al., "Systematic study of Ge1-x Snx absorption coefficient and refractive index for the device applications of Si-based optoelectronics," *J. Appl. Phys., vol.* 119, no. 10, Mar. 2016, Art. no. 103106).

Increase the absorption efficiency of GeSn within a resonant cavity first requires a DBR optimized for high reflectivity around the designed wavelength (1550 nm or 2000 nm). A transfer matrix method is utilized to calculate the reflectivity and reflection phase of the DBR considering the refractive index, wavelength and number of DBR layers. The characterized matrix for light transmitting through a single layer is given by:—

$$M = \begin{bmatrix} \cos(k_0h) & i\sin(k_0h)/\Gamma \\ i\Gamma\sin(k_0h) & \cos(k_0h) \end{bmatrix} \quad \text{Equation 1}$$

where $$\Gamma = \frac{\varepsilon_0}{\mu_0} n\cos\theta \quad k_0h = nd\cos\theta \cdot 2\pi/\lambda \quad \text{Equation 2}$$

θ and λ are the refractive angle and the wavelength of incident light, respectively. n and d are refractive index and the thickness of the layer, respectively.

Then the characterized matrix for light transmitting through multilayers may be obtained by:—

$$M = M_1 \times M_2 \times \ldots \times M_n = \begin{bmatrix} m_{11} & m_{12} \\ m_{21} & m_{22} \end{bmatrix} \quad \text{Equation 3}$$

Then the reflectivity R and reflection phase Ψ can be obtained by:—

$$r(\lambda) = \frac{\Gamma_0 m_{11} + \Gamma_0\Gamma_s m_{12} - m_{21} - \Gamma_s m_{22}}{\Gamma_0 m_{11} + \Gamma_0\Gamma_s m_{12} + m_{21} + \Gamma_2 m_{22}} \quad \text{Equation 4a}$$

$$R(\lambda) = |r(\lambda)|^2 \quad \text{Equation 4b}$$

$$\psi(\lambda) = -\arg[r(\lambda)] \quad \text{Equation 4c}$$

where subscripts s and 0 refer to the substrate and incident material, respectively.

In separate absorption and carrier multiplication (SACM) SPAD, single-photon detection efficiency (SPDE) is defined as the probability that a photon absorbed in the SPAD and the photo-generated carrier quickly drifts to the multiplication region to trigger an avalanche event. The SPDE is given by Equation 5 as follow:—

$$\text{SPDE} = \eta_{abs}\eta_{inf} \times Pe(z_p) \quad \text{Equation 5}$$

where $\eta_{abs}$ is the absorption efficiency, $\eta_{inf}$ is the collection efficiency of the photogenerated carriers injected from the absorber to the multiplication layer and $Pe(Z_p)$ is the avalanche triggering probability for electrons at the location of the depletion region edge on the p-side.

According to a previous study on Ge SPAD, $\eta_{inf}$ does not represent the limiting effect of the SPDE.

The absorption efficiency $\eta_{abs}$ of the RCE SPAD is estimated by Equation 6 as follow:—

$$\eta_{abs} = \left\{ \frac{1 + R_2 e^{-\alpha d}}{1 - 2\sqrt{R_1 R_2 e^{-\alpha d}}\cos(2\beta L + \psi_1 + \psi_2) + R_1 R_2 e^{-2\alpha d}} \right\} \times (1 - R_1)(1 - e^{-\alpha d}) \quad \text{Equation 6}$$

where $R_1$ and $R_2$ are the reflectivity of the top and bottom cavity minors, respectively. The $\Psi_1$ and $\Psi_2$ are the mirror reflection phase shifts of the top and bottom cavity mirrors, respectively. a, d and L represent the absorption coefficient and the thickness of the GeSn layer, the thickness of GeSn/Si, respectively. $\beta = 2\pi n/\lambda_0$ is the propagation constant, where n and $\lambda_0$ are the refractive index and the vacuum wavelength of the incident light, respectively.

The absorption coefficient of GeSn considering absorption from direct bandgap is given by:—

$$a(hv) = \frac{A(hv - E_g^\Gamma)^{\frac{1}{2}}}{hv} \text{ for } hv \geq E_g^\Gamma + \frac{\Delta E}{2} \quad \text{Equation 7}$$

where A and hv is the is a constant and the energy of the incident photon, respectively.

$$E_g^\Gamma$$

is the direct band gap, ΔE is the Urbach width. The absorption from indirect band gap is neglected since the absorption coefficient for indirect band gap transition is small (less than 100 $cm^{-1}$).

The triggering probabilities of electrons $P_e$, and holes $P_h$ at the position z in the depletion region may be obtained by solving the partial differential equations set forth in Equation 8 and Equation 9, respectively, as follow:—

$$\frac{\partial P_e}{\partial z} = (1 - P_e)\alpha_e(E)(P_e + P_h - P_eP_h) \quad \text{Equation 8}$$

$$\frac{\partial P_h}{\partial z} = -(1 - P_h)\alpha_h(E)(P_e + P_h - P_eP_h) \quad \text{Equation 9}$$

where $a_e(E)$ and $a_h(E)$ are the impact ionization coefficients of electron and hole depending on the local electric field. Equation 10 is:—

$$a_v(E) = a_v^\infty e^{-(E_v^0/E)} \quad \text{Equation 10}$$

where v refers to e or h and E is the electric field, $a_v^\infty$ and $E_v^0$ are material constants.

The electrical characteristics of SPAD, such as the breakdown voltage, the electric field distribution can be simulated with the aid of TCAD software Lumerical utilizing Poisson, drift-diffusion and continuity equations.

When there is no light, due to the thermal excitation, minority carriers are generated to trigger avalanche events in the SPAD, which is known as the dark counts. The DCR may be evaluated by:—

$$DCR=S\int(P_e+P_h-P_eP_h)G\,dz \quad \text{Equation 11}$$

where S is the active area of the SPAD and G is the net generation rate of the carries. Three main generation mechanisms are responsible for the DCR of SPAD, including thermal generation and recombination (SRH), trap-assisted tunneling (TAT) and band-to-band tunneling (BTBT).

According to the well-known Schockley-Read-Hall theory, the thermal generation rate of carriers considering the TAT effect is given by:—

$$G_{SRH,TAT} = \frac{n_i}{\frac{\tau_n f}{1+\Gamma}\exp\left[\frac{-(E_t-E_i)}{kT}\right]+\frac{\tau_p f}{1+\Gamma}\exp\left[\frac{(E_t-E_i)}{kT}\right]} \quad \text{Equation 12}$$

where $n_i$ is the intrinsic carrier concentration. $\tau_n$ and $\tau_p$ are the lifetimes of electron and holes respectively, and f is is the correction term accounting for doping concentration effects given by Fossum's model. $E_i$ and $E_t$ are the intrinsic Fermi energy level and recombination center energy levels, respectively. k is the Boltzmann constant and T is the absolute temperature.

Carrier lifetimes are related to the trapping density $N_t$ and TDD $N_{TDD}$, which may be expressed by:—

$$\tau_{n,p} = \frac{C}{N_{TDD}} \quad \text{Equation 13}$$

where C is a material parameter. Since there is few studies on GeSn, results for Ge photodiodes was used as a realistic starting point to extract the parameter C, which is estimated to be 5.25 s/cm$^2$.

Additionally, Γ is the field-effect function of trap-assisted-tunneling (TAT) model, given by:—

$$\Gamma = 2\sqrt{3\pi}\frac{|E|}{E_\Gamma}\exp\left[\left(\frac{E}{E_\Gamma}\right)^2\right] \quad \text{Equation 14}$$

where $$E_\Gamma = \frac{\sqrt{24m_t^*(kT)^3}}{q\hbar} \quad \text{Equation 15}$$

The parameter $m_t^*$ is the effective tunneling mass. When the electric field strength is larger than 7×10$^5$ V/cm at room temperature, band-to-band tunneling (BTBT) is found to be significant.

The BTBT generation rate of carriers for indirect bandgap semiconductors is given by Hurkx's model as set forth in Equation 11, as follow:—

$$G_{BTBT} = B|E|^{2.5}\exp\left(-\frac{E_0}{E}\right) \quad \text{Equation 16}$$

where B and $E_0$ are material parameters.

Based on the simulated SPDE and DCR, NEP may be estimated as:—

$$NEP = \frac{hv}{SPDE}\sqrt{2DCR} \quad \text{Equation 17}$$

Fabrication Flow for the RCE GeSn SPAD

Figure 5:
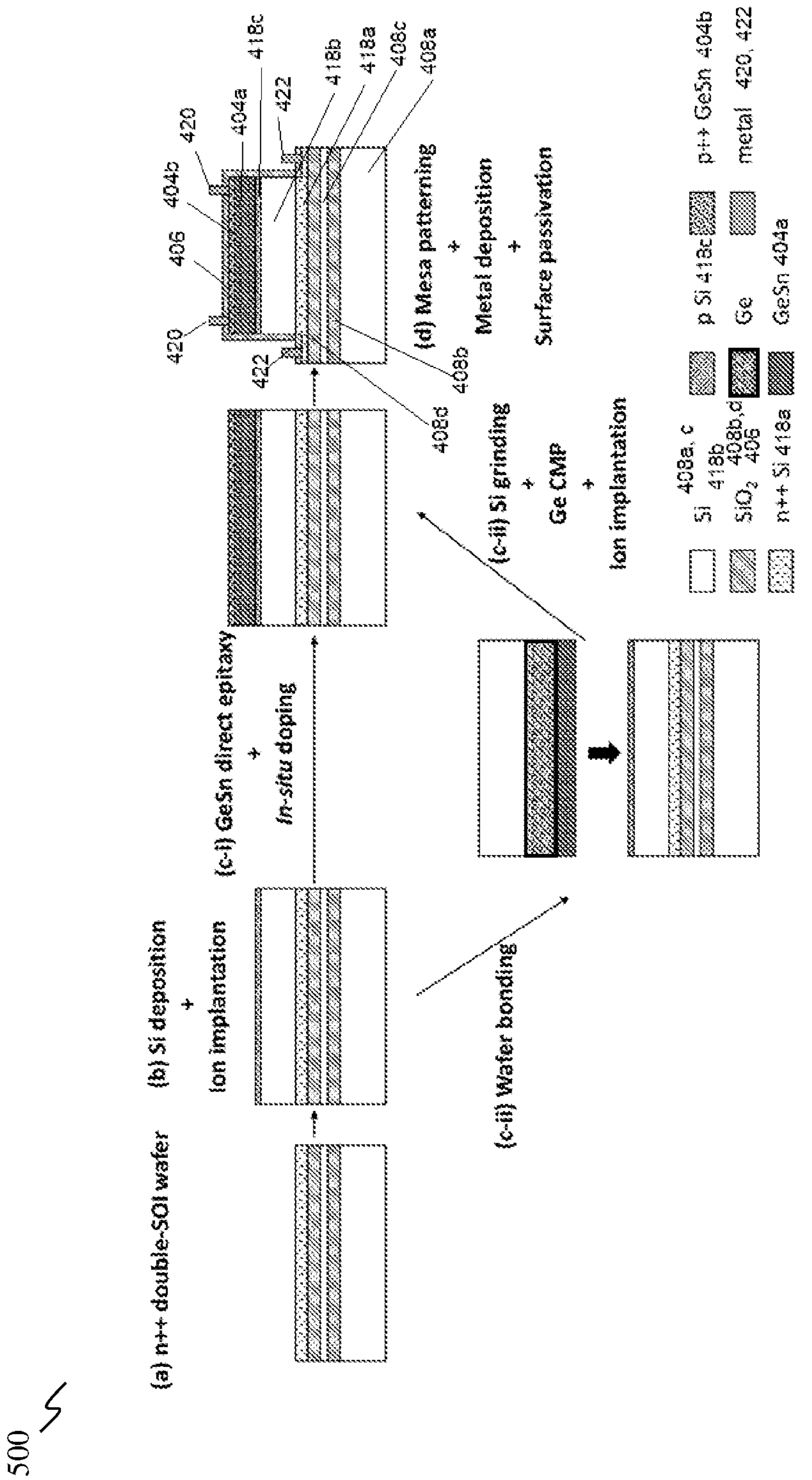
FIG. 5 shows a schematic diagram illustrating a fabrication process of the RCE GeSn SPAD, according to various examples.

The SPAD is grown on n++ doped silicon substrates with buried DBR fabricated using a commercially available double-SOI process. FIG. 5 shows a schematic diagram 500 illustrating a fabrication process of the RCE GeSn-based SPAD 400, in accordance with two alternative examples.

Firstly, a 1 μm Si multiplier 418*b* is grown by a commercial RPCVD system. The charge sheet layer is doped by ion implantation with boron acceptors, followed by rapid thermal annealing at 950° C. for 30 s. Then, after cleaning, a 320 nm intrinsic GeSn 404*a* and a 50 nm p++ GeSn top contact layer 404*b* are grown on top of Si charge sheet layer 418*c* by RPCVD (step c-i). Alternatively, GeSn/Ge/Si wafer may be bonded to the doped double-SOI wafers by direct wafer bonding technique, followed by Si grinding, Ge chemical mechanical polishing (CMP) and ion implantation (step c-ii), which is expected to have lower TDDs than that of direct epitaxial GeSn. A thin Ge layer may be optionally formed or remained from the Ge CMP process, residing over the p++ GeSn layer. Then, the mesa is defined by lithography and dry etching. Finally, metal contacts 420, 422, passivation layers 406 are deposited.

Preliminary Results on Simulation, Modeling and Fabrication of RCE GeSn SPAD

For the optical design of the device (RCE GeSn SPAD), the structure of the device, including Sn content, cavity length and DBR reflectivity, are carefully analyzed and optimized to achieve the best absorption efficiency. For the electrical design, the I-V curve, electric field and avalanche triggering probabilities, which account for the single-photon performances, are studied. The single-photon performance of the RCE GeSn SPAD in terms of SPDE, DCR and noise equivalent power (NEP) at room temperature are evaluated. The effect of threading dislocation on noise is analyzed. The impact of GeSn intrinsic/background doping on the device is also discussed. Characteristics and performances of the SPAD were evaluated as followed.

Figure 6A:
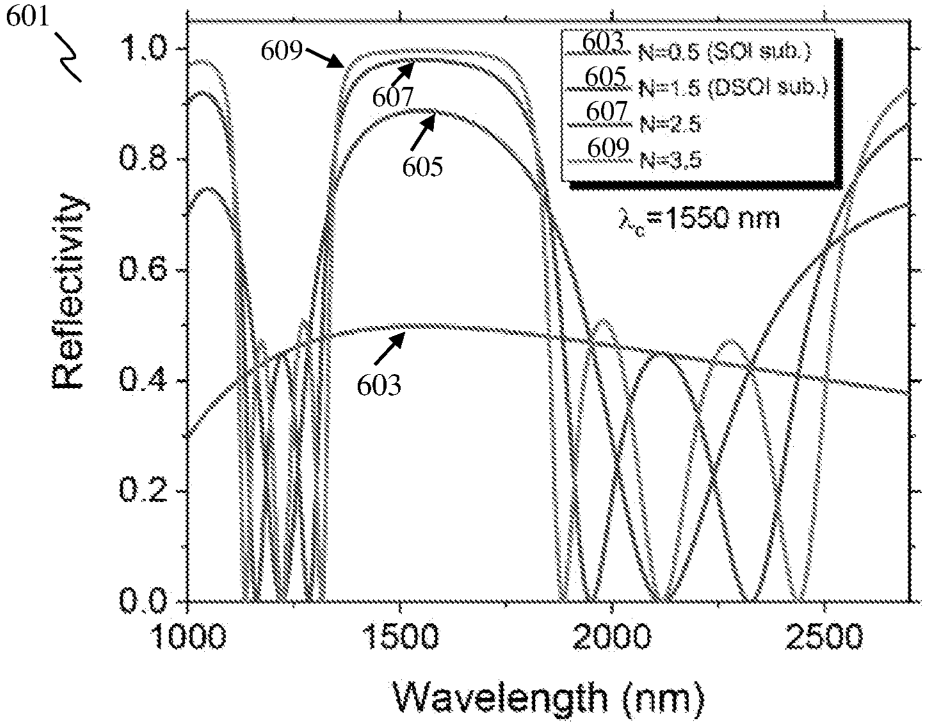
FIGS. 6A and 6B show graphs illustrating the simulated reflectivity of DBRs with different Si/$SiO_2$ pairs (N) which are designed to be highly reflective at 1550 nm and 2000 nm wavelength, respectively, according to various examples.
Figure 6B:
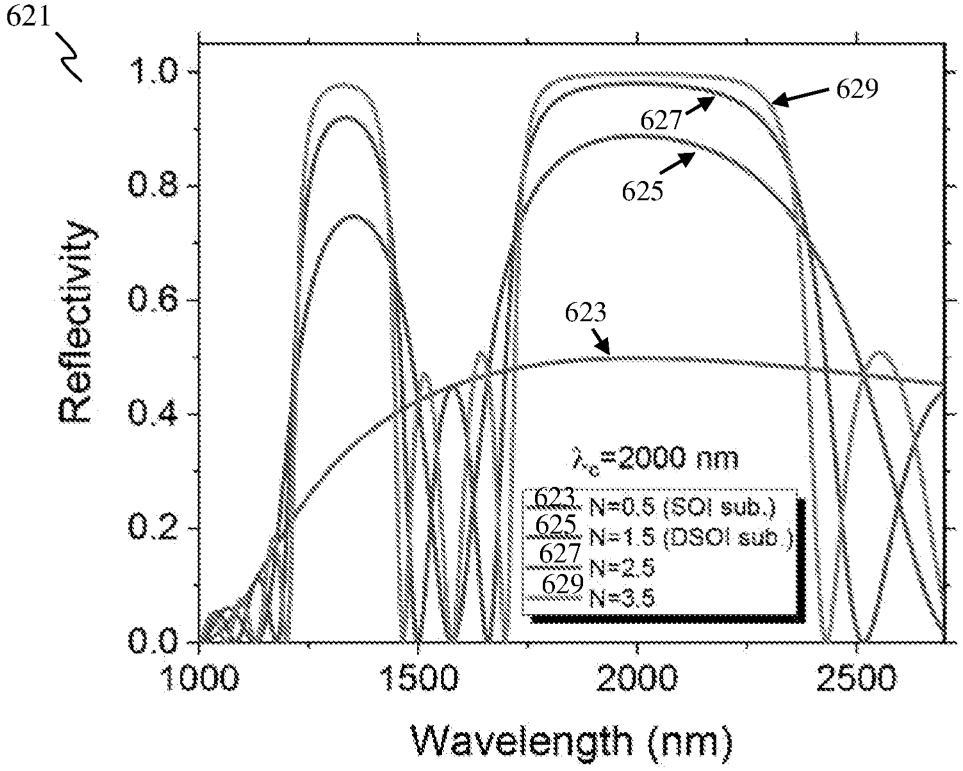

FIGS. 6A and 6B show graphs 601, 621 illustrating the simulated reflectivity of DBRs with different Si/SiO$_2$ pairs (N) which are designed to be highly reflective at 1550 nm and 2000 nm wavelength, respectively. In FIG. 6A, the DBR has a thickness of 335 nm/269 nm for 1550 nm wavelength, while in FIG. 6B, the DBR has a thickness of 432 nm/347 nm for 2000 nm wavelength. Since both Si and SiO$_2$ are transparent to the 1550 nm and 2000 nm wavelength, there is no absorption loss in the DBR. Considering the limitation of the fabrication process, 3λ/4n-thick Si is chosen for the DBR. The reflectivity increases significantly with the increase of Si/SiO$_2$ pairs. DBR with 0.5 pair of Si/SiO$_2$ (SOI substrate) 603, 623 is unable to provide sufficient reflectivity for the RCE structure. DBR with 1.5 pairs of Si/SiO$_2$ (double-SOI substrate) 605, 625 is able to provide a reflectivity of about 89% at the designed wavelength. Due to the large refractive index between Si and SiO$_2$, the DBR with 2.5 pairs of Si/SiO$_2$607, 627 may provide greater than 95% reflectivity over a wide band around 1550 nm and 2000 nm, which is sufficient for a high absorption efficiency. The DBR with 3.5 pairs of Si/SiO$_2$ 609, 629 may have reflectivity coming close to 100%. Though increasing N>4 may make the reflectivity of DBR approaches to 100%, the fabrication burden may increase as well. Therefore, 2.5 to 3 pairs of $Si/SiO_2$ may be the preferred choice considering both the efficiency and fabrication complexity.

Figure 6C:
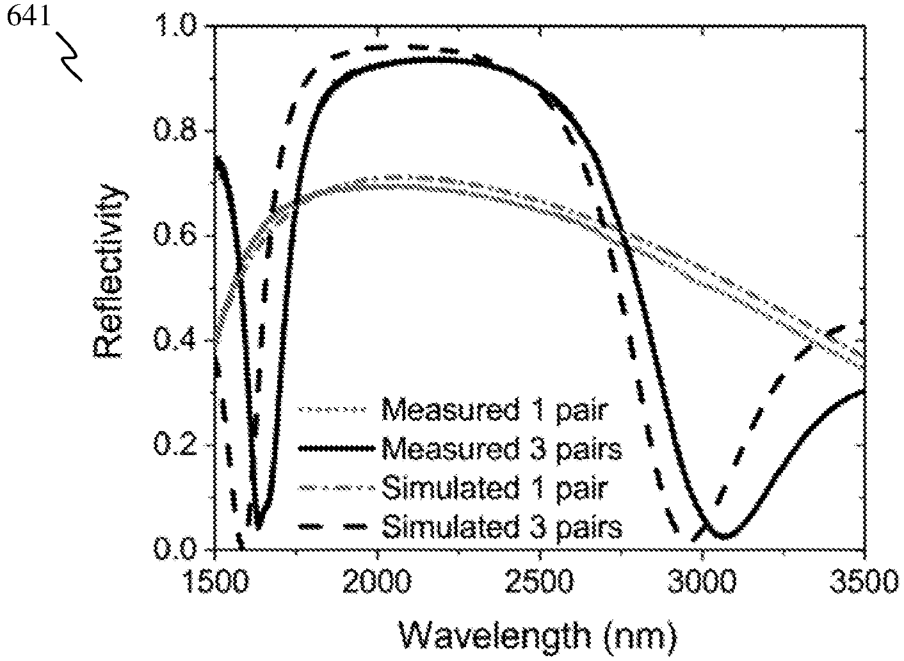
FIG. 6C shows a graph illustrating measured and simulated free-space reflectivity of distributed Bragg reflectors (DBRs) with different numbers of Si/$SiO_2$ pairs at the SWIR regime, according to various examples.

FIG. 6C shows a graph 641 illustrating measured and simulated free-space reflectivity of distributed Bragg reflectors (DBRs) with one $Si/SiO_2$ pair and three $Si/SiO_2$ pairs at the SWIR regime, according to various examples. As shown in FIG. 6C, the measured and simulated reflectivity follow similar trends, and the relatively small discrepancy therebetween may be due to the variation of the thickness during growth which may need to be optimized further. Further, it is observed that the reflectivity of DBRs with three $Si/SiO_2$ pairs is comparatively higher than that of DBRs with one $Si/SiO_2$ pair at wavelengths in the range of about 1550 nm to about 2500 nm. The measured reflectivity is in line with the simulated reflectivity in that reflectivity increases with the increase of $Si/SiO_2$ pairs.

Figure 7A:
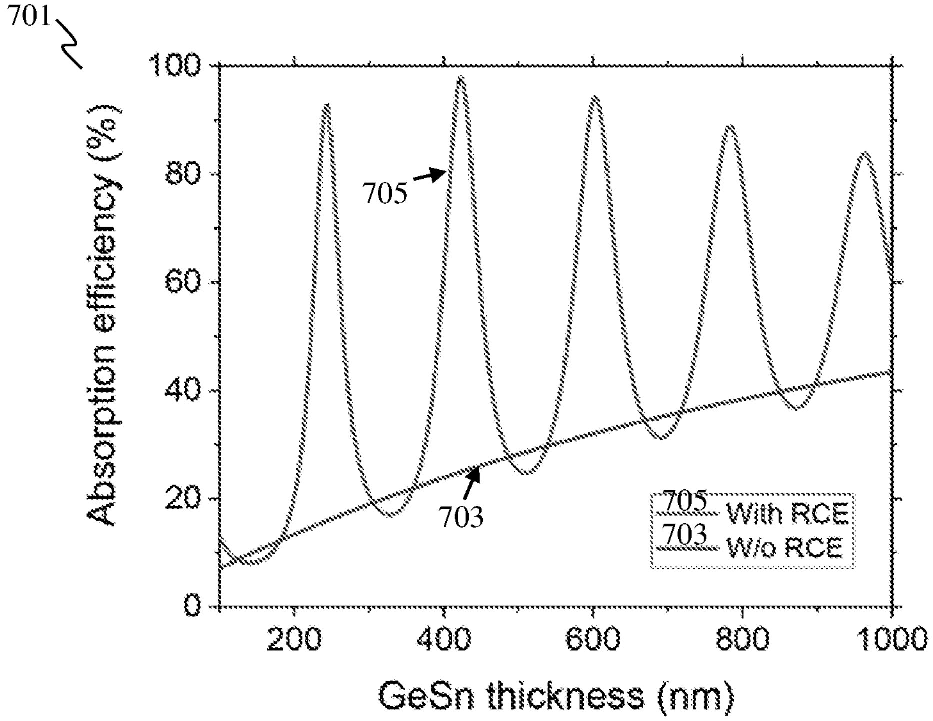
FIG. 7A shows a graph illustrating simulated absorption efficiency of RCE GeSn structure and reference structure (same structure but without DBR) as a function of the GeSn thickness at the wavelength of 1550 nm, according to various examples.
Figure 7B:
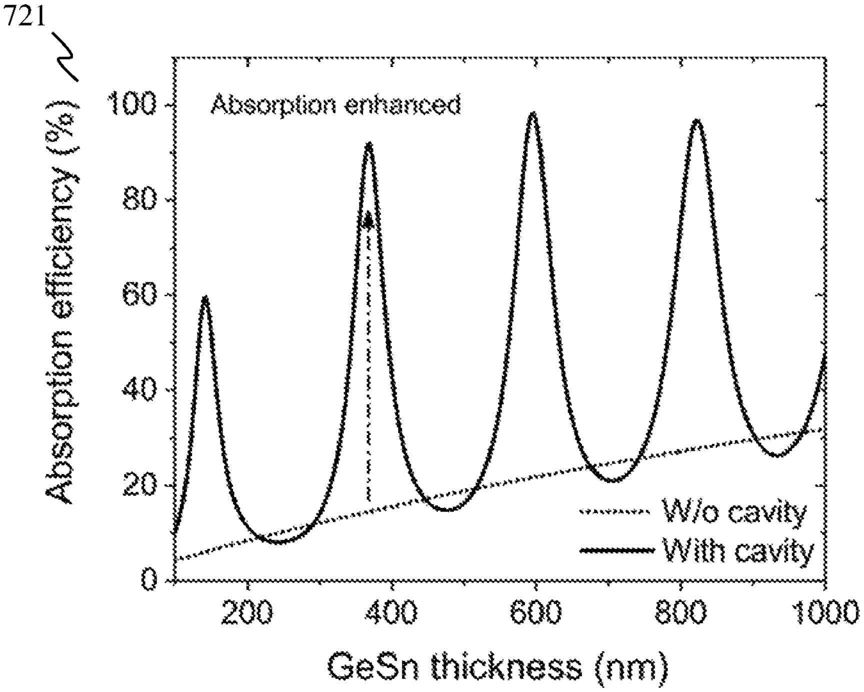
FIG. 7B shows a graph illustrating simulated absorption efficiency of RCE GeSn structure and reference structure (same structure but without DBR) as a function of the GeSn thickness at the wavelength of 2000 nm, according to various examples.

Increasing the absorption efficiency of GeSn within a resonant cavity first requires the DBR optimized for high reflectivity around the designed wavelength of 1550 or 2000 nm Under the optimized DBR and Sn concentration (see FIG. 8B), the thickness of GeSn layer is studied to obtain a resonance and achieve a high absorption efficiency at 1550 nm or 2000 nm. Based on equation 6, the absorption efficiency of GeSn structures at 1550 nm and 2000 nm may be simulated. FIG. 7A shows a graph 701 illustrating simulated absorption efficiency of RCE $Ge_{0.97}Sn_{0.03}$ SPAD 705 and a reference structure (same structure without DBR) 703 as a function of the GeSn thickness at the wavelength of 1550 nm, according to various examples. FIG. 7B shows a graph 721 illustrating simulated absorption efficiency of a RCE GeSn structure (e.g. the SPAD 400 of FIG. 4) and reference structure (same structure but without DBR or without an optical cavity) as a function of the GeSn thickness at the wavelength of 2000 nm, according to various examples. The RCE GeSn structure has a DBR with 2.5 $Si/SiO_2$ pairs, e.g. 2 $Si/SiO_2$ pairs with an additional $SiO_2$ overlying layer.

It is observed from FIGS. 7A and 7B that absorption enhancement is experienced by the RCE GeSn structure (that is, with an optical cavity) at various GeSn thicknesses.

The absorption efficiency of the RCE GeSn SPAD periodically increases as the GeSn thickness increases which is due to the resonance in the optical cavity. For 1550 nm band, with a GeSn thickness of 423 nm, the theoretical absorption efficiency tends to saturate (about 98%) for RCE GeSn SPAD and only 25% for the same thickness of GeSn without a cavity. Absorption at 2000 nm shows a similar high absorption efficiency. With a GeSn thickness of 368 nm, the theoretical absorption efficiency at 2000 nm is about 98% for RCE GeSn and only 22% for the same thickness of GeSn without a cavity. The absorption efficiency of RCE GeSn structures is 4 to 5 times of that of GeSn without a cavity which benefits the SPDE enhancement of SPAD. It is attractive that the GeSn RCE structure without top DBR reflector may achieve such high absorption efficiency.

Figure 8A:
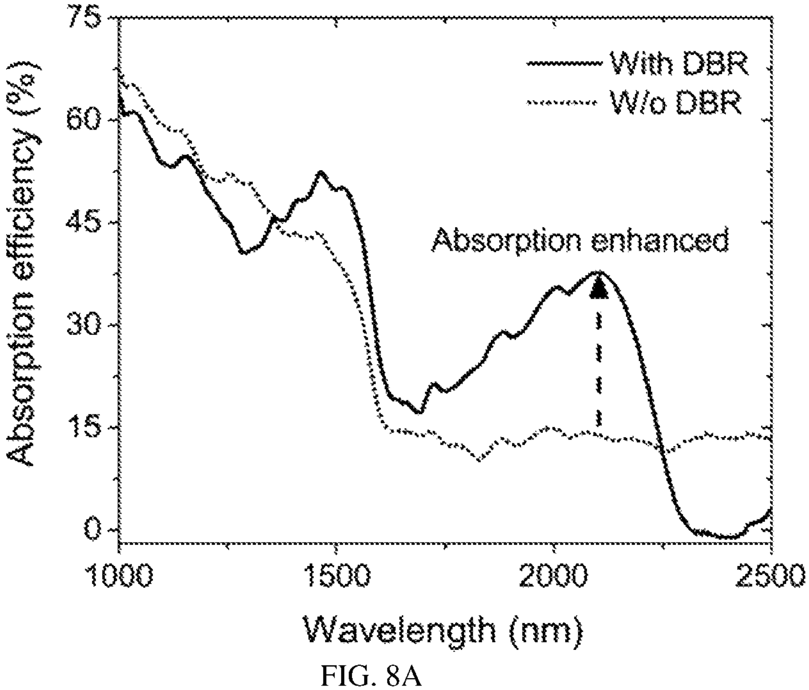
FIG. 8A shows a graph illustrating absorption efficiency of GeSn/Ge/Si with a DBR on the backside of a substrate measured by spectral ellipsometry (SE), where a GeSn sample without a DBR is measured as a reference, according to various examples.

FIG. 8A shows a graph 801 illustrating absorption efficiency of GeSn/Ge/Si with a DBR having three $Si/SiO_2$ pairs on the backside of a substrate measured by spectral ellipsometry (SE), where a GeSn sample without a DBR is measured as a reference, according to various examples. It is observed from FIG. 8A that absorption enhancement is experienced by GeSn/Ge/Si with the DBR at the SWIR regime.

Figure 8B:
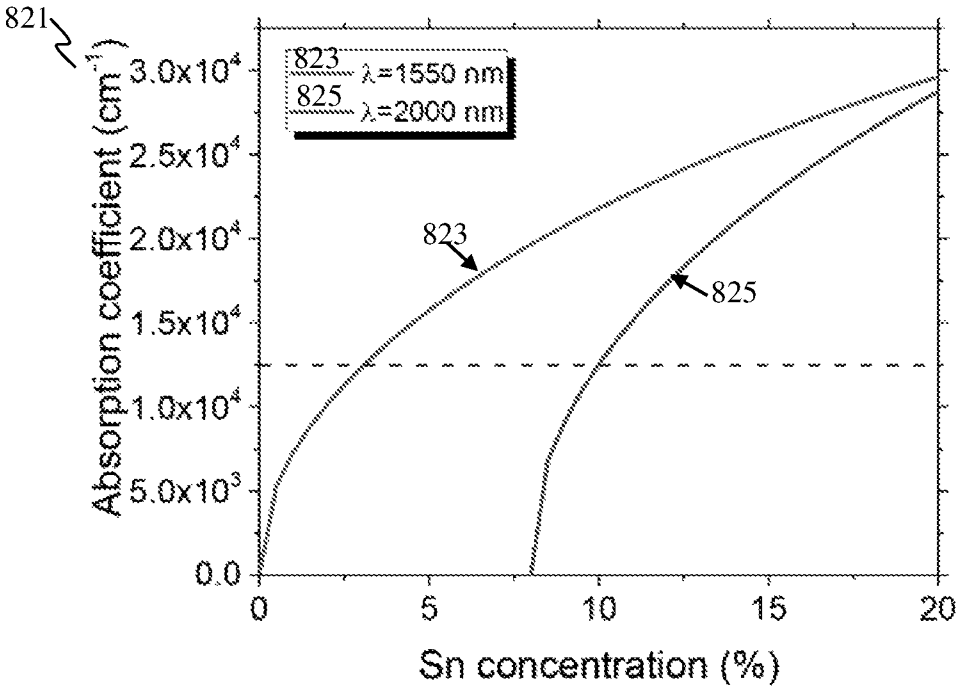
FIG. 8B shows a graph illustrating absorption coefficient of pseudomorphic GeSn on Ge as a function of Sn concentration for light wavelength of 1550 nm and 2000 nm, respectively, according to various examples.

FIG. 8B shows a graph 821 illustrating the calculated absorption coefficient of pseudomorphic $Ge_{1-x}Sn_x$ alloys on Ge with different Sn concentrations for 1550 nm wavelength (see line 823) and 2000 nm wavelength (see line 825) at room temperature. The dotted line in FIG. 8B refers to an absoprtion coefficient at 12500 $cm^{-1}$. It is noted that the absorption coefficient of GeSn at both 1550 nm and 2000 nm wavelength may be enhanced by increasing Sn concentration. Therefore, GeSn, as the active absorption layer, has advantages over Ge at 1550 nm wavelength and is able to cover the 2000 nm wavelength. Here, the Sn concentration is tuned to achieve an absorption coefficient as high as 12500 $cm^{-1}$, which is comparable to conventional III-V absorption materials. Higher absorption coefficients may be achieved with higher Sn concentration. However, the lattice mismatch between GeSn and substrate increases and growth temperature decreases, resulting in the degradation of the material quality. Besides, the bandgap may shrink further. Both effects increases the noise (DCR) of the SPAD considerably. Thus Sn concentrations x=3% and x=10% may be chosen for 1550 nm wavelength and 2000 nm wavelength, respectively.

In designing an RCE GeSn-based SPAD, the thickness and doping profile of each layer are optimized for high performance. Table 1 summarizes the thicknesses and doping profiles of the GeSn-based SPAD (e.g. 400 of FIG. 4).

TABLE 1

Thickness and doping concentration of RCE GeSn SPAD

| Layer | Thickness (nm) | Doping concentration ($cm^{-3}$) |
|---|---|---|
| p++ GeSn contact layer | 50 | $5 \times 10^{19}$ (p) |
| i GeSn absorption layer | 318 for 2000 nm wavelength<br>373 for 1550 nm wavelength | $1 \times 10^{15}$ (p) |
| p Si charge sheet layer | 50 | $3 \times 10^{17}$ (p) |
| i Si multiplication layer | 1000 | $1 \times 10^{15}$ (p) |
| n++ Si contact layer | 220 | $1 \times 10^{20}$ (n) |

To achieve a high triggering probability of an avalanche event, a thick Si multiplication layer may be chosen. The thickness of GeSn layer may be designed to obtain a resonance and achieve a high absorption efficiency at 2000 nm Based on Equation 6 above, the absorption efficiency is simulated and shown in FIG. 7B. The absorption efficiency of the RCE Ge SPAD periodically increases as the GeSn thickness increases. With a GeSn thickness of 368 nm, the theoretical absorption efficiency at 2000 nm is 98% for RCE GeSn and only 22% for the same thickness of GeSn without a cavity. The absorption efficiency of RCE GeSn is about 5 times of that of GeSn without a cavity which benefits the SPDE enhancement of SPAD. To verify the absorption enhancement effect of the DBR, the DBR was deposited on the backside of GeSn/Ge/Si substrates and the absorption spectrum was measured by SE. As shown in FIG. 8A, obvious absorption enhancement at around 2000 nm wavelength is obtained as well.

Figure 9A:
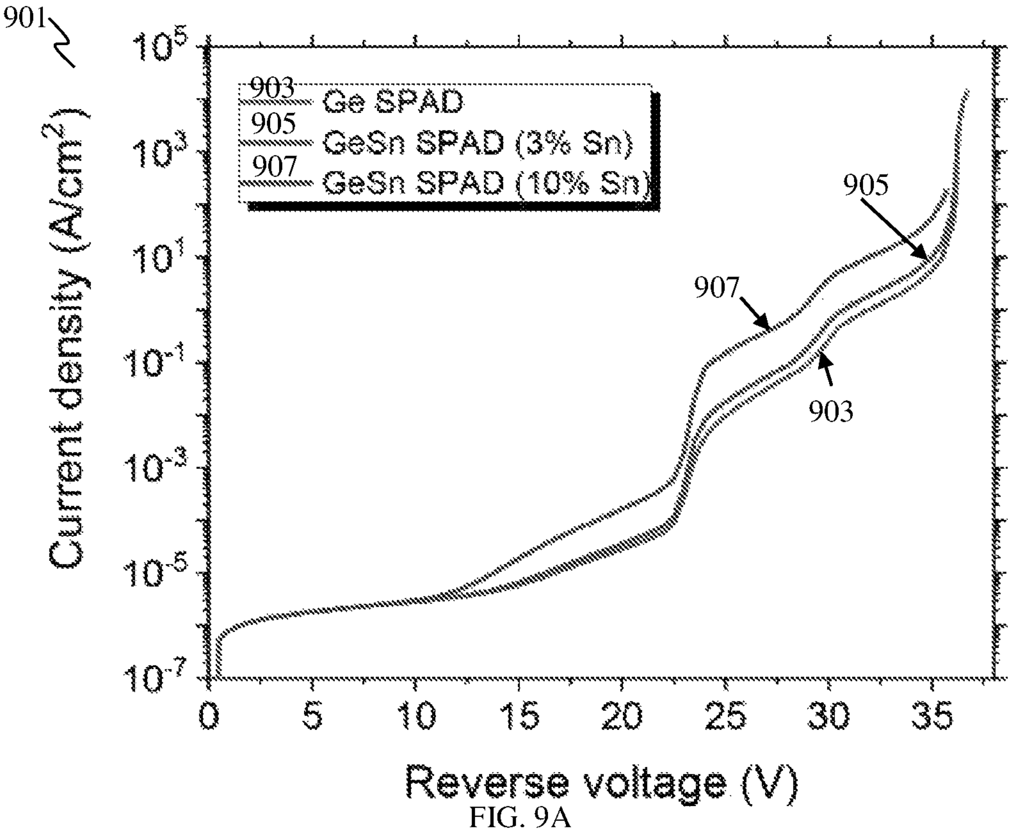
FIG. 9A shows a graph illustrating dark current density versus the reverse voltage of GeSn and Ge SPADs at room temperature, according to various examples.
Figure 9B:
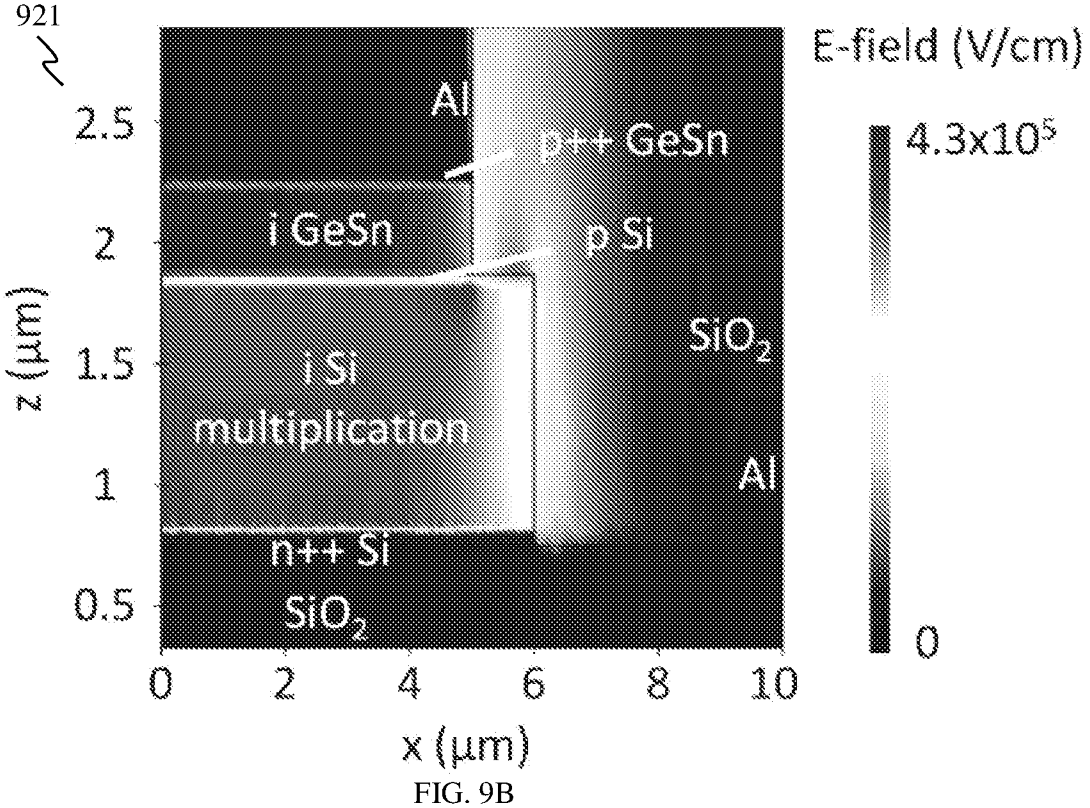
FIG. 9B shows a graph illustrating 2D electric field distribution in a RCE GeSn SPAD for a reverse voltage of 39 V, according to one example.
Figure 9C:
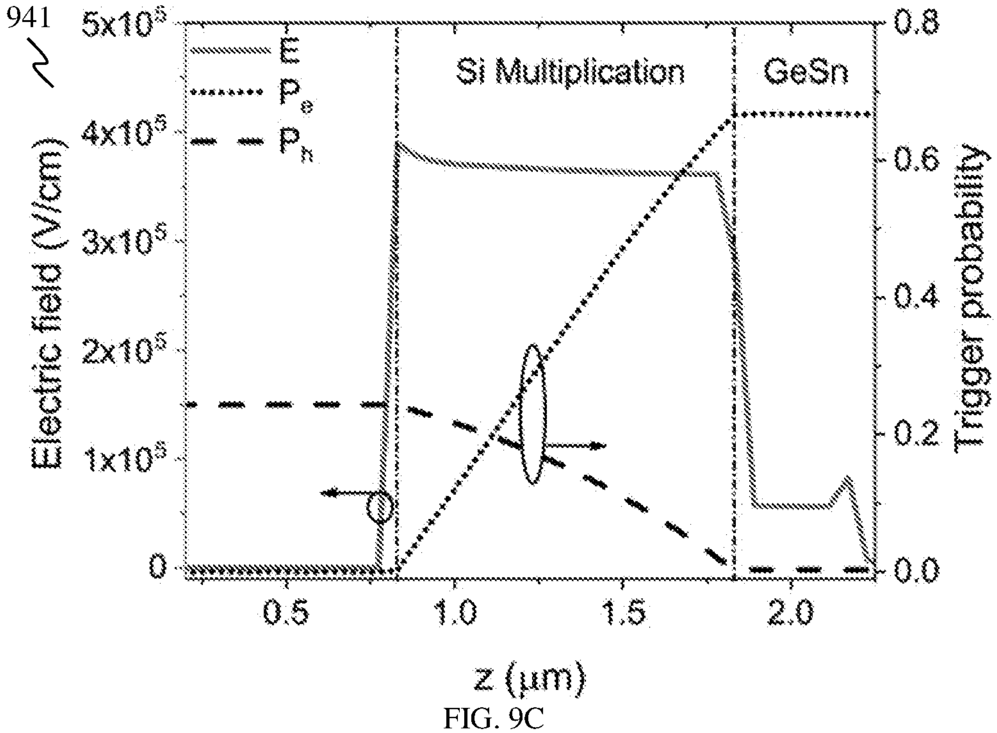
FIG. 9C shows a graph illustrating electric field distribution, triggering probabilities of electrons and holes along z-coordinate across the center of a SPAD with 3 V excess voltage above breakdown voltage at room temperature, according to one example.

The simulated electrical characteristics and statistical properties, e.g. avalanche triggering probabilities, of the RCE GeSn SPADs with 10 μm diameters are shown in FIGS. 9A to 9C.

Firstly, the dark current density versus the reverse voltage (J-V) characteristic of SPAD operating at room temperature is simulated and shown in a graph 901 of FIG. 9A. Ge SPAD 903 is also simulated as a reference device. Due to the lack of the ionization coefficient values for GeSn, impact ionization coefficients of Ge are used. The carrier lifetime $\tau_n$=$\tau_p$32 0.2 ns of GeSn are used in this simulation. The trap states are assumed to be near the mid bandgap of GeSn according to the deep-level transient spectroscopy (DLTS) measurements. There are some discrepancies in the energy of trap states that may be due to the different material growth conditions or different origins of trap states such as vacancies, dislocation and excess of Sn atoms. The J-V curves 905, 907 indicate avalanche effects of the SPADs with a breakdown voltage of 36 V. The punch-through voltage, which is the voltage at which the electric field penetrates into the GeSn absorption layer resulting in an efficient collection of photo-carriers, is estimated to be about 23 V. Both breakdown voltage and punch-through voltage are almost the same for GeSn SPAD with different Sn concentrations. The dark current density is about 1.3 to 1.7 A/cm$^2$ for 90% of the breakdown voltage. The value is comparable to the results of reported Ge APDs. The dark current density of GeSn SPADs, especially biased above punch through voltage, increases due to the increased intrinsic carrier densities of GeSn by bandgap shrinkage. This result is consistent with reported GeSn/Si APDs.

FIG. 9B shows a graph 921 illustrating the simulated 2D spatial electric field distribution of SPAD for a reverse voltage of 39 V (3 V above the breakdown voltage of 36V). It is indicated that the electric field satisfies the two design considerations: (1) a high and and homogeneous electric field confined in the Si multiplication layer; (2) a moderately low electric field in GeSn absorption layer to drift photo-carriers into the multiplication layer.

FIG. 9C shows a graph 941 illustrating the electric field distribution (solid line) as well as triggering probabilities (black short dotted line and black dashed line) of electrons and holes along z-coordinate across the center of the SPAD with 3 V excess voltage above breakdown voltage at room temperature. It is noted that the maximum value of the electric field in the Si multiplication layer is lower than 7×10$^5$ V/cm, which makes the contribution of BTBT for DCR negligible. The electric field in GeSn absorption layer is higher than 3×10$^4$ V/cm (e.g. about 5×10$^4$ V/cm), which makes photo-generated carries drifted at a saturation velocity and may be injected to the Si multiplication layer effectively before recombination. The SPAD employed is an electron-avalanche SACM structure, which means only photo-generated electrons drift into the multiplication layer and contribute to the SPDE. Therefore, the triggering probability of electrons P e is more interesting for the design, as shown in the black short dotted line in FIG. 9C. The electron triggering probability $P_e$, as expected, is 0 at the bottom of Si multiplication layer and increases to a maximum value of 0.66 to 0.67 at the bottom of the GeSn absorption layer due to the high electric field in the Si multiplication layer. $P_e$ keeps unchanged in the GeSn layer due to the relatively low electric field within it. Therefore, according to the simulation results, the designed RCE GeSn SPAD demonstrates an optimized electric field distribution and a high electron triggering probabilities, which can be considered as a viable prototype for the SPAD fabrication.

Figure 10A:
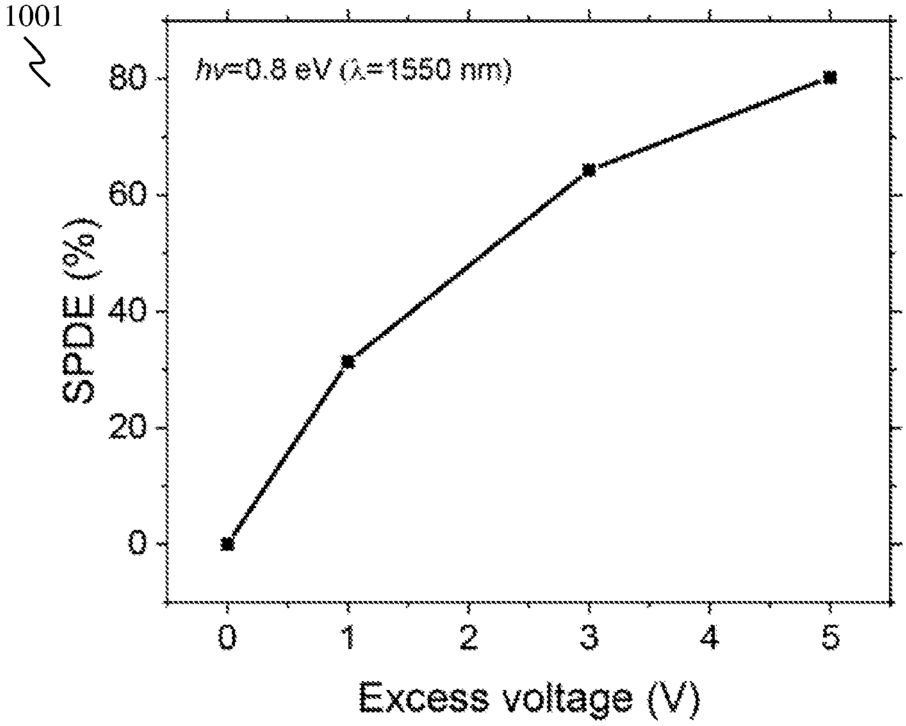
FIG. 10A shows a graph illustrating calculated SPDE as a function of excess voltage at 1550 nm, according to one example.
Figure 10B:
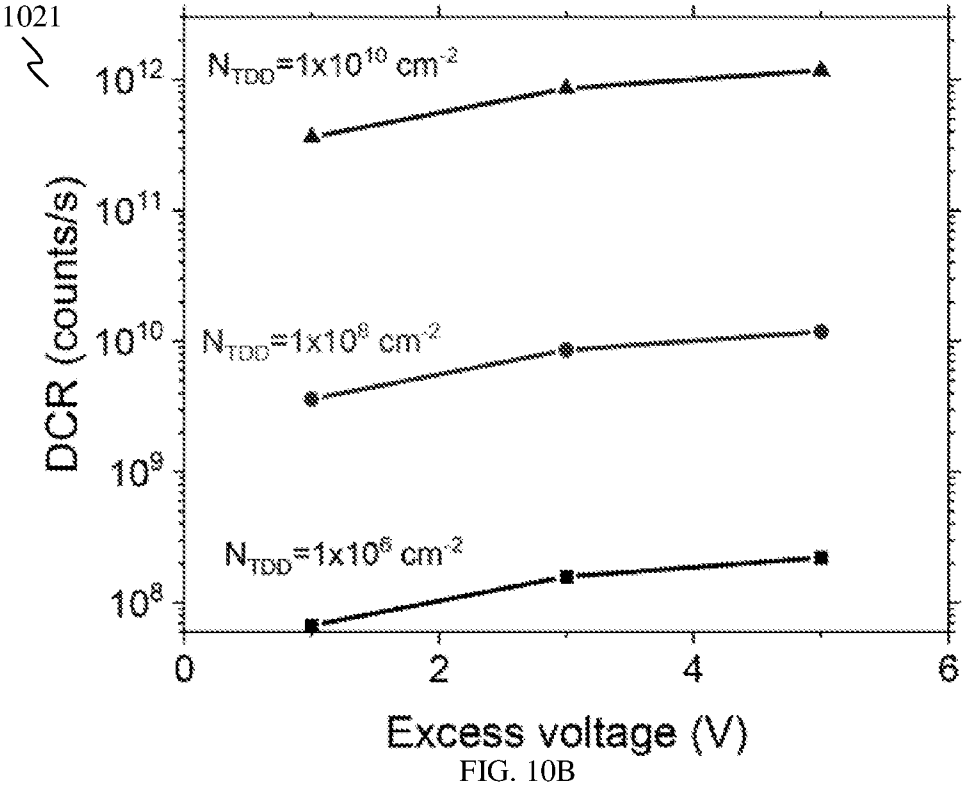
FIG. 10B shows a graph illustrating calculated DCR as a function of the excess voltage for different TDD values at room temperature at 1550 nm wavelength, according to various examples.
Figure 10C:
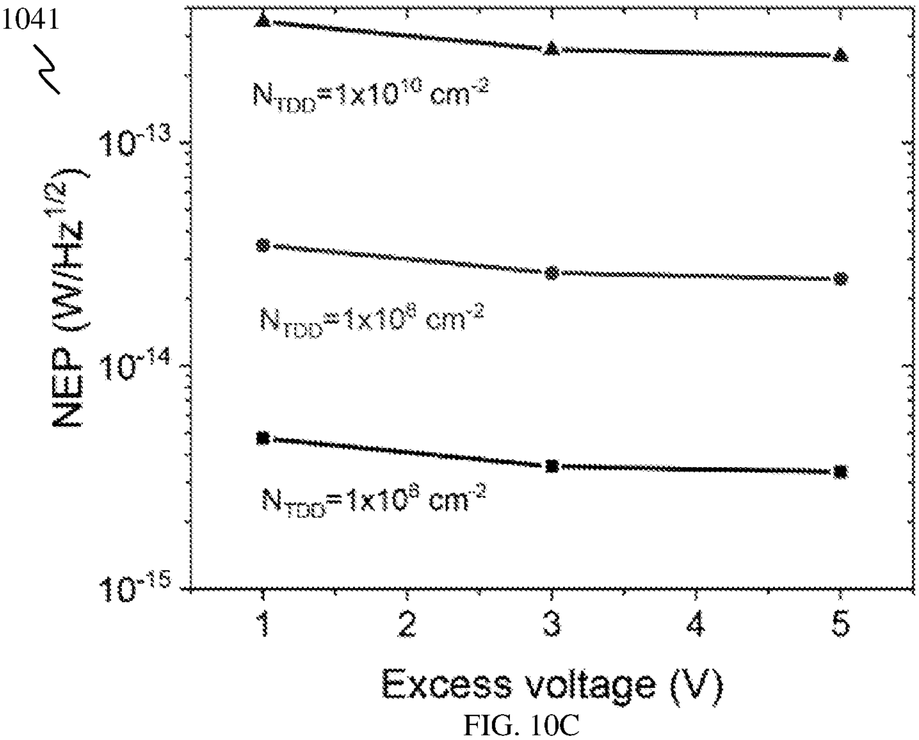
FIG. 10C shows a graph illustrating calculated noise-equivalent power (NEP) as a function of the excess voltage for different TDD values at room temperature at 1550 nm wavelength, according to various examples.

The figures of merit for single-photon detection including SPDE, DCR and NEP are simulated as a function of excess bias voltage above breakdown voltage at room temperature, for different TDD values. The performances of the $Ge_{0.97}Sn_{0.03}$ SPAD for photons with 0.8 eV energy (λ=1550 nm) are shown in FIGS. 10A to 10C. FIG. 10A shows a graph 1001 illustrating calculated SPDE as a function of excess voltage at 1550 nm. FIG. 10B shows a graph 1021 illustrating calculated DCR as a function of the excess voltage for different TDD values at room temperature at 1550 nm wavelength. FIG. 10C shows a graph 1041 illustrating calculated NEP as a function of the excess voltage for different TDD values at room temperature at 1550 nm wavelength.

When the excess bias voltage is 0 (Reverse voltage=36 V), the triggering probability is 0, which means carriers cannot trigger any avalanche events, resulting in no response to a single photon and the SPDE is 0. The result also indicates that the electrical simulation predicts an accurate breakdown voltage. As the excess bias voltage increases to 5 V, the SPDE reaches a value of about 75% to 80%. The high value of the SPDE is due to the high absorption efficiency and high avalanche triggering probability of the RCE structure. Since the absorption efficiency does not limit the SPDE, the SPDE of RCE SPAD mainly depends on the triggering probability which may be controlled by reverse excess voltages. Therefore, the designed SPAD with such high SPDE is interesting for some emerging quantum applications demanding a high SPDE, such as linear optical quantum computing (needs >67% SPDE).

However, the DCR also increases as excess bias voltage increases (FIG. 10B). The straightforward way to decrease the DCR may be to cool SPADs to suppress the thermally generated carriers, but considering SPAD without an extra cooling system is more preferred in practical applications, and thus DCR improved by the engineering of material quality of GeSn in terms of TDD may be the better routine. Except extremely defective GeSn layers (TDD>1×10$^{12}$ cm$^{-2}$), most reported TDD values of GeSn on Si substrates are in the order from 10$^6$ to 10$^9$ cm$^{-2}$. Therefore, TDD-dependent DCRs of $Ge_{0.97}Sn_{0.03}$ SPADs with different excess voltages are simulated (FIG. 10B). According to the simulation, when the TDD decreases from 1×10$^{10}$ to 1×10$^6$ cm$^{-2}$, the DCR reduces 4 orders of magnitude. As a consequence, NEP decreases 2 orders of magnitude as well (FIG. 10C). Besides, different from DCR, NEP improves further as excess biasincreases due to the significant enhancement of SPDE. The lowest NEP of the SPAD at room temperature from the simulation is about 3×10$^{-15}$ W/Hz$^{1/2}$.

Figure 11A:
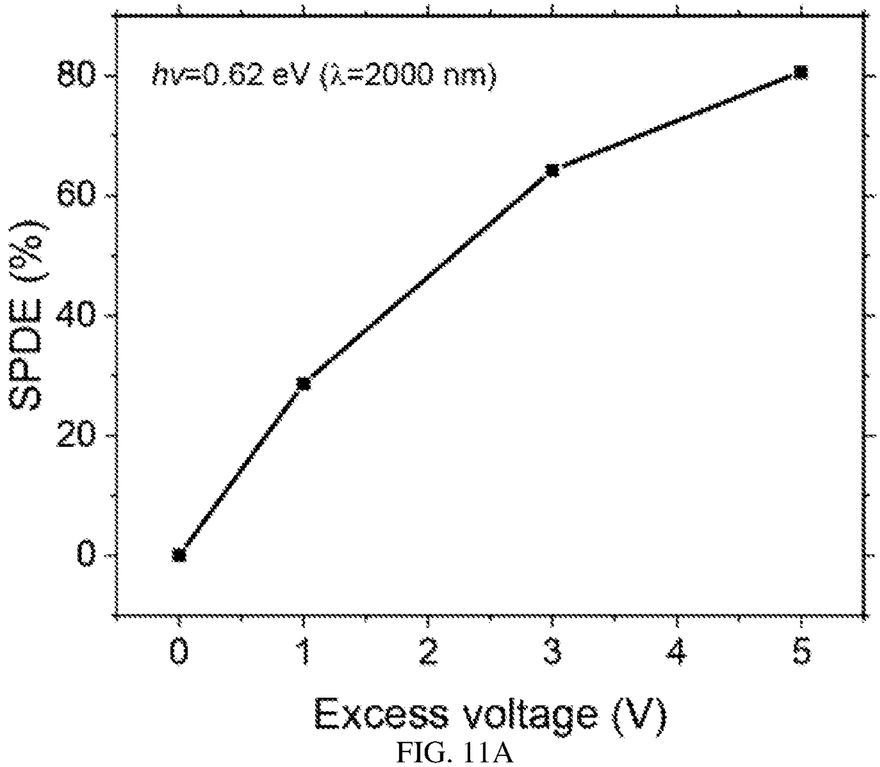
FIG. 11A shows a graph illustrating calculated SPDE as a function of excess voltage at 2000 nm, according to one example.
Figure 11B:
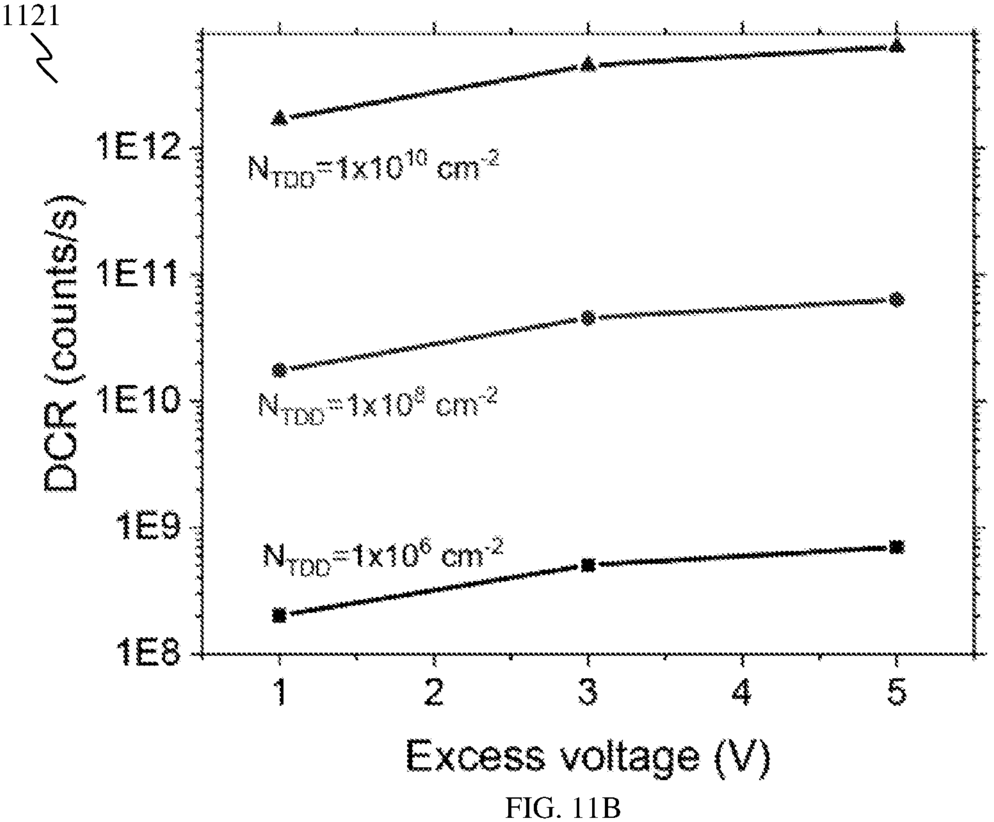
FIG. 11B shows a graph illustrating calculated DCR as a function of the excess voltage for different TDD values at room temperature at 2000 nm wavelength, according to various examples.

The performances of the RCE $Ge_{0.90}Sn_{0.10}$ SPAD for photons with 0.62 eV energy (λ=2000 nm) are shown in FIGS. 11A and 11B. FIG. 11A shows a graph 1101 illustrating calculated SPDE as a function of excess voltage at 2000 nm. FIG. 11B shows a graph 1121 illustrating calculated DCR as a function of the excess voltage for different TDD values at room temperature at 2000 nm wavelength.

Different from Ge SPAD that the SPDE decreases dramatically for longer wavelength detection, RCE GeSn SPAD may maintain a high SPDE even the detection wavelength is extended from 1550 nm to 2000 nm. As shown in FIG. 11A, with an excess bias voltage of 5 V, the SPDE is as high as 80%. However, GeSn SPAD for 2000 nm wavelength suffers from higher DCR than GeSn SPAD for 1550 nm even with the same level of TDD (FIG. 11B). Better material quality control or smaller device dimensions may help to keep the DCR of GeSn SPAD for 2000 nm wavelength to a relatively low level.

Further, it is interesting to compare the designed RCE GeSn SPAD with the reported results of Ge SPADs. The state-of-the-art planar Ge SPAD shows a maximum SPDE of 38% at 1310 nm wavelength at 125 K, representing a significant improvement in the performance. However, the SPDE of the planar Ge SPAD drops significantly to 0.5% at 1550 nm telecom wavelength due to the low absorption coefficient (460 $cm^{-1}$ at 1550 nm wavelength). For the designed RCE GeSn SPAD, the introduction of Sn leads to the device covering the detection wavelength up to 2000 nm while the resonant cavity enhanced effect makes the single-photon detection in the designed wavelength effective with a thin absorber layer. Besides, by engineering the substrate to a low TDD level, the device may operate near room temperature with a similar DCR level to that of Ge SPAD operating at low temperatures.

Figure 12A:
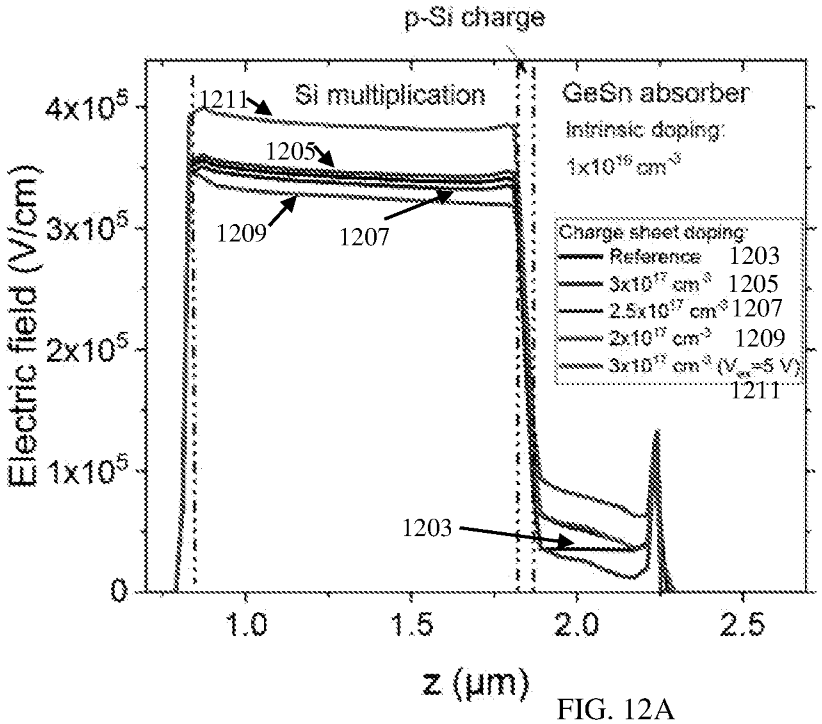
FIG. 12A shows a graph illustrating electric field of $Ge_{0.97}Sn_{0.03}$ SPAD with a GeSn absorber layer background doping of $1\times10^{16}$ $cm^{-3}$, according to various examples.

The impact of the GeSn absorber layer background doping is discussed. GeSn is grown at low temperature (<400° C.) to increase the Sn concentration without Sn segregations. As a consequence, the defects (vacancy/dislocation) density of GeSn layers, especially high-Sn GeSn, increases, resulting in the background doping concentration of GeSn increases from about $10^{15}$ $cm^{-3}$ to about $10^{17}$ $cm^{-3}$. The effect of higher background doping concentrations of $1\times10^{16}$ $cm^{-3}$ and $1\times10^{17}$ $cm^{-3}$ in GeSn layers are simulated, as shown in the 1D electric field profile at a bias of 36 V (see graph 1201 of FIG. 12A with lines 1203, 1205, 1207, 1209, 1211 representing a reference, a charge sheet doping of $3\times10^{17}$ $cm^{-3}$, $2.5\times10^{17}$ $cm^{-3}$, $2\times10^{17}$ $cm^{-3}$, and $3\times10^{17}$ $cm^{-3}$ ($V_{ex}$=5 V), respectively). As shown in FIG. 12A, when the background doping concentration of GeSn increases to $1\times10^{16}$ $cm^{-3}$, the electric field in GeSn absorber (or interchangably referred to GeSn absoprtion layer) decreases from the bottom to the surface of GeSn layer with a minimum electric field intensity of 12 kV/cm, which is not sufficient to drift photon-generated carriers into multiplication layer. The issue may be solved by increasing the reverse bias or decreasing the doping concentration of Si charge layer as indicated by line 1211 and line 1207 in FIG. 12A. However, when the doping concentration of Si charge layer is lower than $2\times10^{17}$ $cm^{-3}$ (see e.g. line 1205), the maximum electric field intensity of GeSn layer is higher than 100 kV/cm, causing the breakdown in GeSn layer.

Figure 12B:
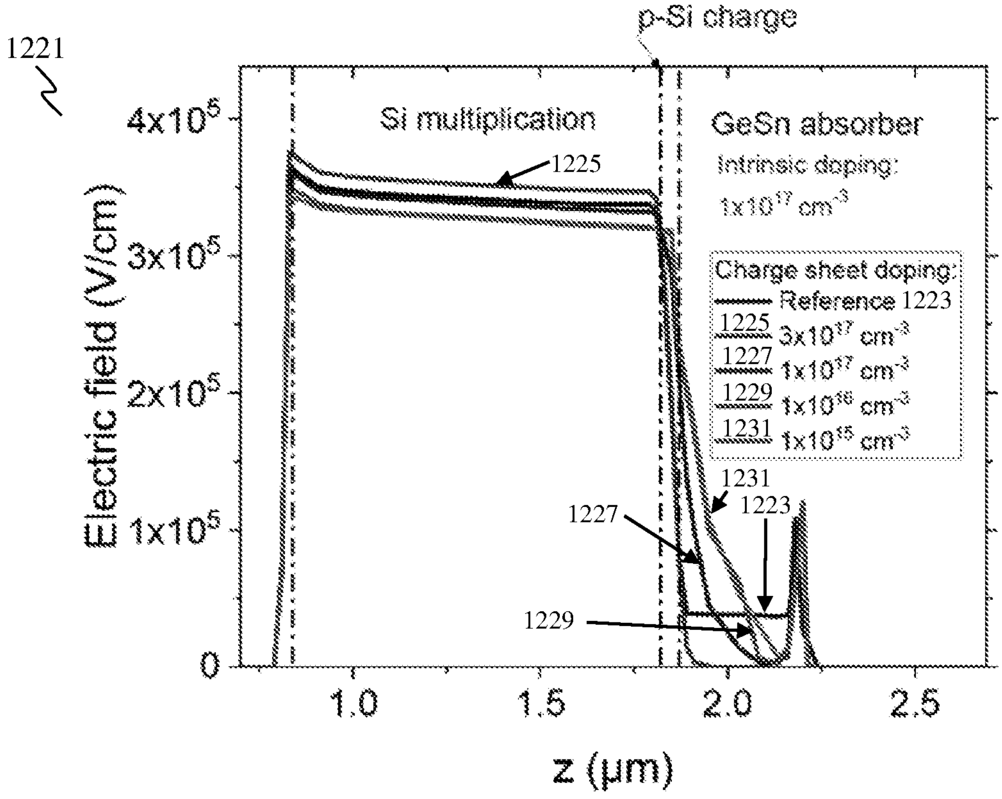
FIG. 12B shows a graph illustrating electric field of $Ge_{0.9}Sn_{0.1}$ SPAD with a GeSn absorber layer background doping of $1\times10^{17}$ $cm^{-3}$, according to various example.

When the background doping concentration of GeSn absorber increases to a high level of $1\times10^{17}$ $cm^{-3}$, the issue of the non-uniform electric field becomes more serious (see graph 1221 of FIG. 12B with lines 1223, 1225, 1227, 1229, 1231 representing a reference, a charge sheet doping of $3\times10^{17}$ $cm^{-3}$, $1\times10^{17}$ $cm^{-3}$, $1\times10^{16}$ $cm^{-3}$, and $1\times15$ $cm^{-3}$, respectively). As shown by the line 1225 in FIG. 12B, the electric field is confined in Si multiplication without depleting GeSn absorber layer, resulting in the device not abling to work. Though tuning the doping concentration of the charge layer may deplete the GeSn layer partially, the high electric field in the bottom of GeSn causes the issue of GeSn breakdown. Therefore, the high background doping concentration of GeSn absorber has a negative impact on the device. To keep the intrinsic doping concentration of GeSn at a low level, reducing the defects (vacancy/dislocation) by growth optimization or post-growth processes is critical for achieving the high-performance GeSn SPADs.

The RCE GeSn SPAD detectors, as described in Design 1, are designed and optimized for high-efficiency single-photon detection at 1550 and 2000 nm wavelength at room temperature for sensing and optical quantum applications. The corresponding fabrication methods based on direct epitaxy and wafer bonding are proposed as well. The results show that high photon absorption efficiency can be achieved by careful design of DBR reflectors, Sn concentration and GeSn thickness. High avalanche triggering probabilities may be achieved with proper doping concentrations of charge sheet layer and multiplication layer thickness. High absorption efficiency and high triggering probability lead to a high SPDE of about 80%, which is interesting for some emerging quantum applications demanding high SPDE, such as linear optical quantum computing. The effects of the TDD on the DCR and NEP are examined as well. The investigation demonstrates that the device may operate near room temperature with a similar DCR level to that of Ge SPAD operating at low temperatures by engineering the substrate to a low TDD level. A NEP of about $3\times10^{-15}$ W/Hz 112 is observed from RCE $Ge_{0.97}Sn_{0.03}$ SPAD for 1550 nm wavelength at room temperature. The impact of the GeSn absorber layer background doping on the device is discussed as well. The designed RCE GeSn SPADs are promising for high-efficiency single-photon detection in the SWIR regime for sensing and optical quantum applications.

It is interesting to compare the designed RCE GeSn SPAD with the reported results of Ge SPADs (see Table 2).

TABLE 2

Summary of the performances of Ge SPAD at SWIR wavelength

| Structure | Status | SPDE @ λ (nm) | DCR (counts/s) | Operating temperature | Diameter (μm) | Absorber thickness (nm) |
|---|---|---|---|---|---|---|
| Mesa GeISi SPAD | Existing | 14% @ 1310 | $1\times10^{8}$~$1\times10^{9}$ | 200 K | 30 | 1000 |
| Mesa Ge/Si SPAD | Existing | 4% @ 1310 | $1\times10^{6}$~$1\times10^{7}$ | 100 K | 25 | 1000 |
| Waveguide Ge/Si SPAD | Existing | 5.27% @ 1310 | $5\times10^{5}$ | 80 K | NA | NA |
| Planar Ge SPAD | Existing | 38% @ 1310; 0.5% @ 1550 | $1\times10^{6}$~$1\times10^{7}$ | 125 K | 100-200 | 1000 |
| RCE GeSn/Si SPAD | Current Designed | 75% @ 2000 | ~$1\times10^{7}$ @$N_{TDD}$ = $1\times10^{6}$ $cm^{2}$ | 300 K | 10 | 320 |

The most reported Ge SPAD demonstrates poor SPDE (4% to 14%) at 1310 nm wavelength at low operation temperature (80 K to 200 K) with a thick Ge layer (1 μm). The state-of-the-art planar Ge SPAD shows a maximum SPDE of 38% at 1310 nm wavelength at 125 K, representing a significant improvement in the performance. However, the SPDE of the planar Ge SPAD drops significantly to 0.5% at 1550 nm telecom wavelength due to the low absorption coefficient of Ge (460 $cm^{-1}$ at 1550 nm wavelength). For the designed RCE GeSn SPAD, due to the introduction of Sn content and the cavity enhance effect, the RCE GeSn SPAD covers the detection wavelength to 2000 nm effectively with a thin absorber layer. Besides, by engineering the substrate to a low TDD level, the RCE GeSn SPAD operates near room temperature with a similar DCR level to that of Ge SPAD operating at low temperature.

The two most straight forward approaches to increase absorption efficiency are:—

Increasing GeSn absorber thickness: However, it may lead to (a) High noise (DCR) due to the increased volume of the absorber and the increased thermal generated carriers.

(b) Low response speed (high time jittering) due to the increased carrier propagation time.

(c) High operating volt-age, causing substantial power dissipation and self-heating problems.

Increasing Sn concentration of GeSn alloys: However, it may lead to (a) High noise (DCR) due to the decreased bandgap of GeSn alloys, resulting in the exponentially increased thermal generated carriers.

(b) Increased defect densities of GeSn absorber due to the increased lattice mismatch between GeSn and substrate, thus increasing noise (DCR) furthermore.

To address the challenges of GeSn SPAD in light absorption, a GeSn SPAD with a vertical cavity as in Design 1 is designed, constructed by the bottom DBR and the top GeSn/air interface. A fabrication method based on GeSn to DBR bonding and transfer technology to form the RCE GeSn SPAD is proposed as well, which has the flexibility of defect engineering. With careful design of the cavity and DBR, 98% of absorption efficiency at a 2000-nm band may be achieved which is about 5 times of that of GeSn without a cavity, resulting in single-photon detection efficiency of 80% at an excess voltage of 5 V. More interesting, by engineering the substrate to a low TDD level, the RCE GeSn SPAD operates near room temperature with a similar DCR level to that of Ge SPAD operating at low temperature. The high-performance SPAD detector in the SWIR regime is one of the most important components to enable numerous emerging applications, such as quantum communication, quantum computing, LIDAR and fluorescence medical imaging. The designed RCE GeSn SPAD would greatly impact economies, communities, health and industries.

For comparison, Table 3 summarizes the differences between the existing art and the designed RCE GeSn SPAD.

TABLE 3

| | WO 2010/033641 A1 | WO 2019/137620 A1 | Current design |
|---|---|---|---|
| Photodetector type | GeSn PD/APD | (Si)GeSn PD/APD/SPAD | RCE GeSn SPAD |
| Single-photon detection ability | No | Yes | Yes |
| Including a resonant cavity | No | No | Yes |
| Quantum/Absorption efficiency | Low <0.4% @1550 nm | Low | High About 100%, owing to cavity enhancement |
| Noise/DCR/dark current | High | High | Low Owing to small volume absorber |
| Cooling (SPAD) | NA | Yes | No |
| Spectral Linewidth | Broadband | Broadband | Narrow Linewidth may be engineered as requirements |
| GeSn layer | Direct epitaxy | Direct epitaxy | Direct epitaxy or wafer bonding |
| Bonding technology | NA | NA | GeSn to DBR bonding |
| Trade-off between detection efficiency and speed | Yes High detection efficiency →low speed | Yes High detection efficiency →low speed | No Both high detection efficiency and speed |
| Trade-off between detection efficiency and noise | Yes High detection efficiency →high noise | Yes High detection efficiency →high noise | No Both high detection efficiency and low noise |
| Quantum device | No | Yes | Yes |
| SACM structure | Yes | Yes | Yes |
| Operating bias voltage | Below breakdown voltage | Above breakdown voltage | Above breakdown voltage |
| Design complexity | Low | Low | High Cavity and DBR to be carefully designed |

Design 2: GeSn-on-Insulator Dual-Waveband Resonant-Cavity-Enhanced Photodetectors at the 2000 nm and 1550 nm Optical Communication Bands Germanium-tin-on-insulator (GSOI) has emerged as a new platform for three-dimensional (3D) photonicintegrated circuits (PICs). Here, a GSOI dual-waveband resonant-cavity enhanced (RCE) metal-semiconductor-metal (MSM) PD resonating at both 2000 nm and 1550 nm bands. 10% Sn, which is the highest Sn content of reported single-crystalline GSOI, is introduced into the GeSn layer to shrink the direct bandgap and extend the photodetection wavelength range, more specifically to the 2000 nm band. A vertical Fabry-Pérot cavity is formed by the surface of the GeSn layer and burried insulator due to the large refractive index contrast between the GeSn, the insulator layer and the air, thereby confining light in the active layer and enhancing the optical responsivity of the device. By optimizing the cavity length, the responsivity of the GeSn PD shows resonant peaks at 2000 nm and 1550 nm bands, covering cover a wide wavelength range near both the 2000 nm and conventional telecommunication bands.

Figure 13:
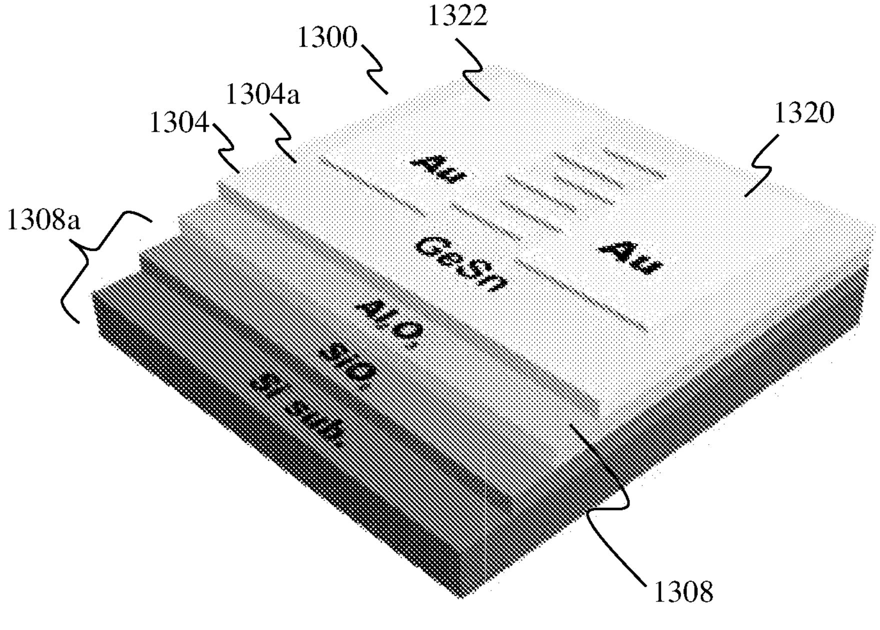
FIG. 13 shows a schematic diagram illustrating a perspective view of a designed GeSn dual-waveband RCE MSM photoconductive detector (PD) on a GSOI platform, according to one example.

FIG. 13 shows a schematic diagram illustrating a perspective view of a designed GeSn dual-waveband RCE MSM photoconductive detector 1300 on a GSOI platform 1308*a*, in accordance with one example.

The GeSn layer 1304 serves as the light absorption layer and metal (e.g. gold, Au) pads 1320, 1322 with interdigitated metal fingers are deposited on the top of the GeSn layer 1304 as contacts. Due to the large refractive index contrast between GeSn (n being about 4.34), the air (n=1) and aluminum oxide, $Al_2O_3$ (n being about 1.73), the GeSn surface 1304*a* and $Al_2O_3$ layer 1308 act as the top and bottom reflectors, respectively, constructing a vertical Fabry-Pérot cavity 1304*a*, 1308 which confines the incident light effectively. The incident light has a multiple-absorbing path inside the GeSn layer 1304 due to the multiple reflections. When the device is at resonance, an amplified optical field is formed in the cavity and the optical responsivity is enhanced.

For example, the GeSn dual-waveband RCE MSM photoconductive detector 1300 may be described in similar context as the photodiode detector 100 of FIG. 1A, and thus the vertical Fabry-Pérot cavity 1304*a*, 1308, the GeSn surface 1304*a*, the GeSn layer 1304, the $Al_2O_3$ layer 1308 may be described in similar contexts as the optical cavity 102, the overlying light-receiving portion 106, the GeSn absorption layer 104, and the underlying minor 108 of FIG. 1A, respectively.

Figure 14A:
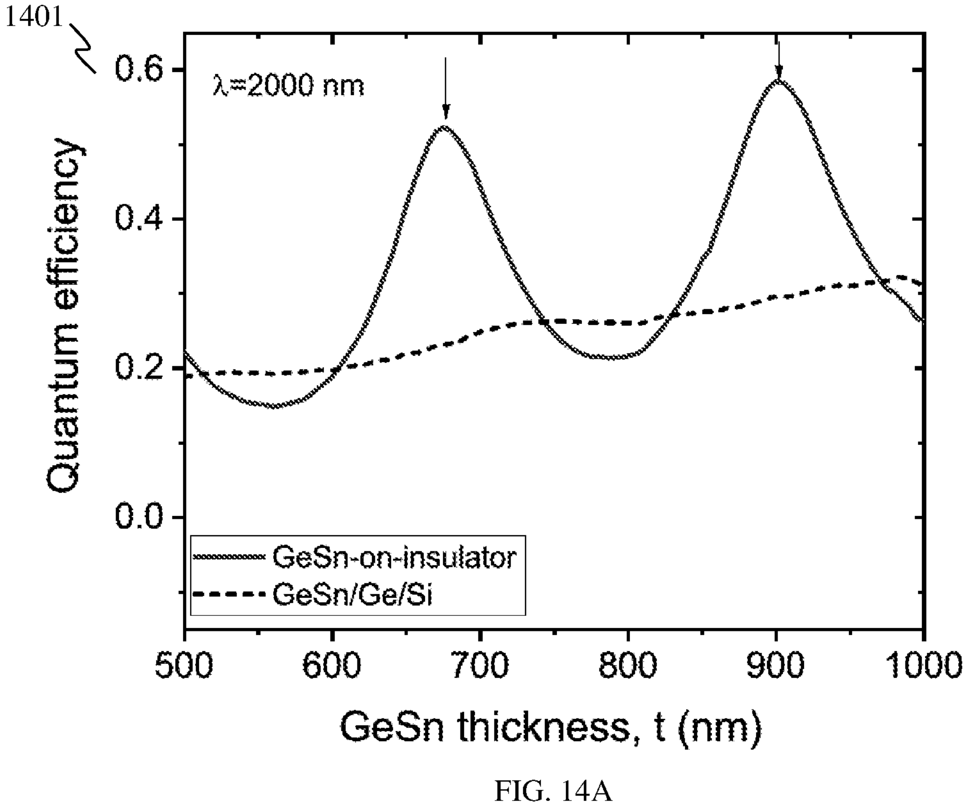
FIG. 14A shows a graph illustrating a relationship between simulated quantum efficiency versus GeSn thickness of the detector of FIG. 13 and a reference without cavity.

The resonant wavelength is decided by the cavity length (GeSn thickness, t). The thickness of the GeSn active layer 1304 is optimized to make the device resonate at 2000 nm. The quantum efficiency (QE) (the number of electron-hole pairs generated per incident photon) of the GSOI RCE PD 1300 with varying GeSn thicknesses is analyzed by finite-difference time-domain (FDTD) simulations, in which a plane wave was utilized as the incident light and dispersive optical constants (FIGS. 15A and 15B) (obtained by spectral ellipsometry) are considered. FIG. 14A shows a graph 1401 illustrating a relationship between simulated quantum efficiency (QE) versus GeSn thickness, in other words, the simulated QE spectra of the GSOI PD at 2000 nm wavelength with varying GeSn thicknesses, t. The thicknesses of $Al_2O_3$ and $SiO_2$ are 140 nm and 1000 nm, respectively. The as-grown structure of GeSn/Ge/Si (Ge thickness equals that of insulator layers of GSOI) with varying t is simulated as well for reference. The QE of the GSOI PD increases periodically as the GeSn thickness increases which is due to the light interference in the optical cavity. With a GeSn thickness of 900 nm, the QE approaches a maximum value of 58% and only 30% for the same thickness of GeSn without a cavity. The second highest QE is 52% with a GeSn thickness of 675 nm. Therefore, a 900-nm-thick GeSn layer 1304 is chosen for the fabrication of the GSOI RCE PD 1300. The QE spectrum of the GSOI PD 1300 with a 900-nm-thick GeSn layer 1304 is calculated and shown in a graph 1421 of FIG. 14B which illustrates simulated spectral quantum efficiency of the GSOI dual-waveband RCE PD 1300 with thicknesses of 900 and 600 nm.

Figure 14B:
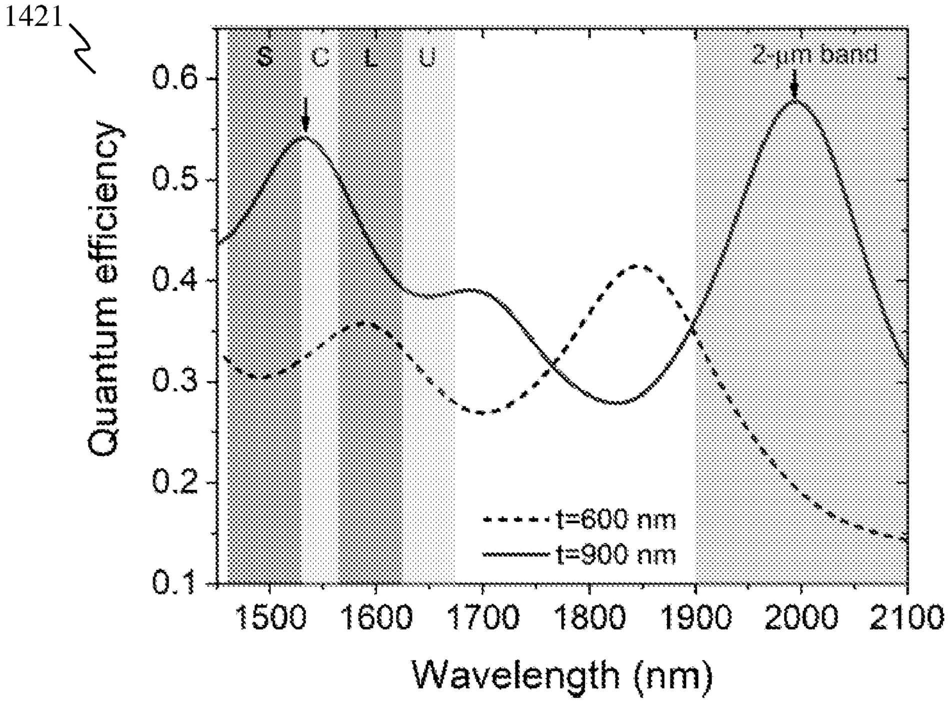
FIG. 14B shows a graph illustrating simulated spectral quantum efficiency of the GSOI dual-waveband RCE PD with thicknesses of 900 and 600 nm, according to various example.

In FIG. 14B, it is noted that two resonant peaks centered at 2000 nm and 1530 nm, are observed when the GeSn layer 1304 is 900 nm thick. Thus, the designed GSOI RCE PD 1300 is interesting for the application in both the current fiber-optics networks (S, C, L, U band) and emerging 2000 nm communication system. The resonant wavelength may be tuned to different wavelengths by varying GeSn thicknesses as indicated by the black dashed line. To understand the origin of the resonant peaks in the QE spectra, the electric field magnitude profile in the device under 2000 nm wavelength illumination light 1444 is simulated as shown in a schematic diagram 1441 of FIG. 14C which illustrates simulated electric field magnitude profile in the GSOI dual-waveband RCE PD with a 900 nm thick GeSn layer under a wavelength of 2000 nm illumination.

A vertical standing wave is formed within the GeSn layer. Thus, the strong spatial overlap between the optical field and the GeSn active region causes the resonant-cavity-enhanced peak of QE at 2000 nm wavelength.

Based on the optimized design, the GSOI was fabricated by low temperature wafer-bonding and layer transfer. The fabrication processes for GSOI substrate and PD are CMOS-compatible. After 1 nm Ge buffer layer was deposited on Si substrate, 900 nm the GeSn film was deposited by the reduced pressure chemical vapor deposition (RPCVD) system. 1 nm of thermal oxide was grown on a handle Si wafer. Subsequently, 200 nm of amorphous aluminum oxide ($Al_2O_3$) was deposited on both GeSn and thermal oxide wafers via atomic layer deposition (ALD). Chemical mechanical polishing (CMP) then was carried out to thin down and smoothen the surface of the $Al_2O_3$. Both the GeSn and thermal oxide wafers were exposed to an oxygen, $O_2$ plasma for 15 secs to increase the surface hydrophilicity. The two wafers were brought into contact and bonded via direct wafer fusion bonding, followed by post-bonding annealing for 3 hours in nitrogen, $N_2$ environment at 250° C. to improve the bonding strength.

The Si of the carrier GeSn wafer was then removed by backside grinding and wet etching. CMP was then utilized to remove the Ge buffer layer and thin down the GeSn layers 1304. Then the GSOI sample was immersed in buffered oxide etchant to remove the surface GeSn oxide layers. Interdigitated electrode metal-semiconductor-metal (MSM) structures (titanium/gold, Ti/Au: 10/80 nm) were achieved by photo-lithography and electron-beam deposition, followed by a lift-off process. The active area (100×100 $nm^2$) consists of 8 nm interdigitated metal fingers with 8 nm spacings (FIG. 16B).

The distribution of Sn and Ge atoms in the GeSn layer was measured by secondary-ion mass spectrometry (SIMS) (the inset of FIG. 15A). A relatively uniform distribution of Sn atoms is observed and the obtained Sn concentration is 10%. The optical constants (refractive index and absorption coefficient) of the sample were characterized by spectral ellipsometry. FIGS. 15A and 15B show the measured refractive index and absorption coefficient of the GeSn layer in the GSOI (other layers such as $Al_2O_3$ and $SiO_2$ are not shown here) at room temperature. The refractive index of GeSn decreases from 4.4 to 4.3 as the wavelength increases. The higher refractive index of GeSn compared to Ge is an advantage of GSOI which offers better optical confinement than Ge-on-insulator. The absorption coefficient of GeSn at 2000 nm wavelength is obtained to be 6725 $cm^{-1}$ (Ge at 1550 nm: 460 $cm^{-1}$). Such a high value of absorption coefficient at an extended wavelength is due to the introduction of 10% Sn. The absorption coefficient of GeSn at 1550 nm is enhanced to about 12600 $cm^{-1}$ as well.

Figure 16A:
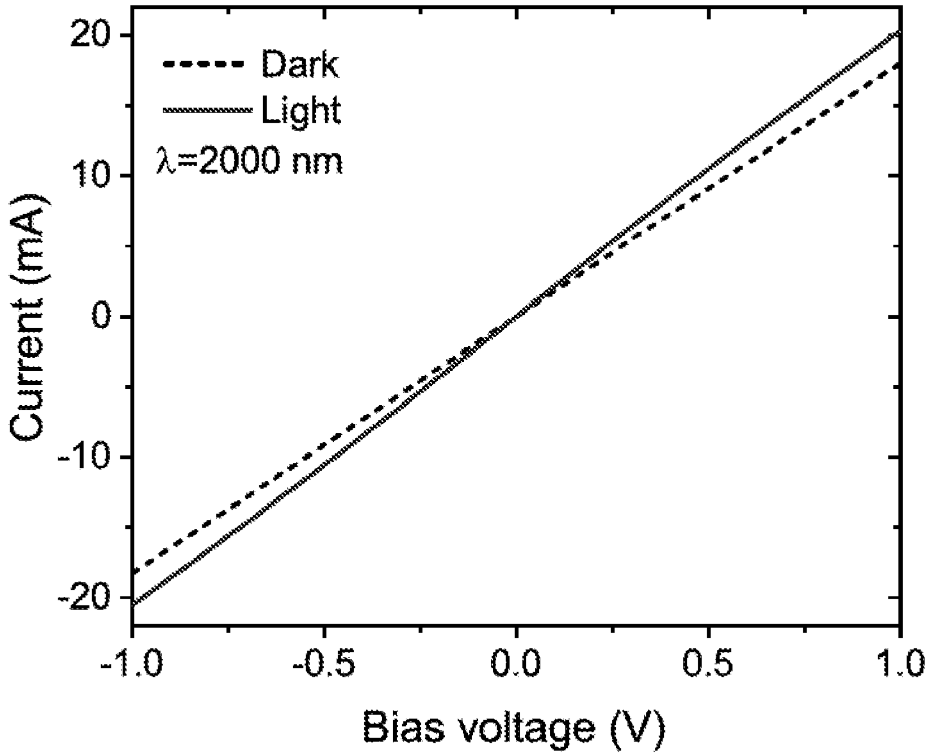
FIG. 16A shows a graph illustrating a dark current-voltage curve of the GSOI RCE PD and photo current-voltage curve of the device under illumination with a wavelength of 2000 nm and a power of 11.4 mW, according to various examples.
Figure 16B:
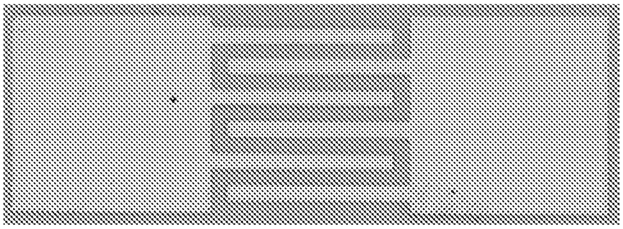
FIG. 16B shows a schematic diagram illustrating a top view of the PD of FIG. 13 from optical microscopy.

FIG. 16A shows a graph 1601 illustrating the dark current-voltage (I-V) curve of the GSOI dual-waveband RCE PD 1300 at room temperature measured using a Keithley 2450 source meter. For the photo current, a 2 nm excitation laser (Thorlabs-FPL2000) with a power of 11.4 mW was used. As shown in FIG. 16A, a linear current-voltage curve is observed, indicating ohmic contacts between the metal and GeSn which is due to the Fermi-level pinning near the GeSn surface 1304*a*. As the PD 1300 is illuminated by the laser, the current increases due to the photo-generated carriers. The result demonstrates the ability of the device for 2 nm (2000 nm) photodetection.

Figure 17A:
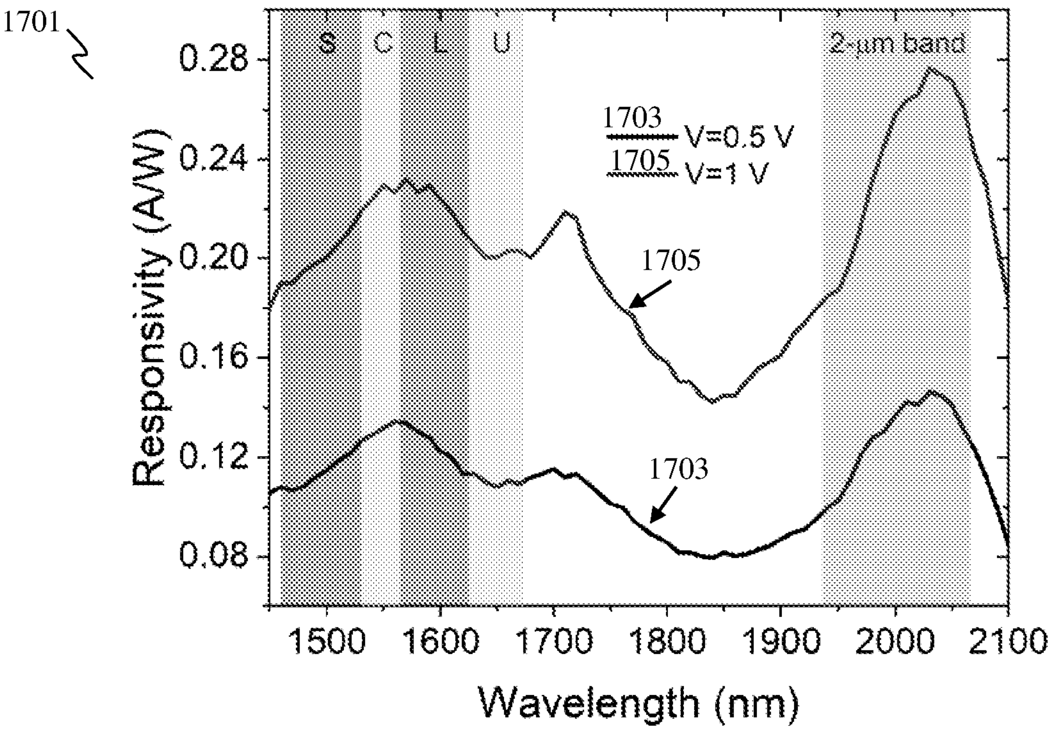
FIG. 17A shows a graph illustrating measured responsivity spectra of the GSOI dual-waveband RCE PD of FIG. 13 with bias voltages of 0.5 and 1 V.

FIG. 17A shows a graph 1701 illustrating the measured responsivity spectra of the GSOI dual-waveband RCE PD 1300 under bias voltages of 0.5 (line 1703) and 1 V (line 1705). The incident light is from a broad-band supercontinuum light source (tunable 400-2400 nm, SC-Pro-7) with a filter (1000-2300 nm, Photon, amongst other) and the power is calibrated by a commercial extended InGaAs PD (FD10D, Thorlabs). To ensure the light (spot size: about 100 nm) from the fiber is within the active region of the device, the position of the fiber is calibrated by maximizing the optical response. Different from the responsivity of conventional GeSn PD which decreases smoothly as wavelength increases, the responsivity spectra of GSOI RCE dual-waveband PDs (e.g. 1300) demonstrate several peaks which are engineered by the devices structure rather than the intrinsic absorption coefficient of GeSn.

The main peak is centered at 2030 nm with a spectral range of 200 nm. The measured peak position is consistent with the peak position of the simulated QE spectrum in FIG. 14B. In addition to the main peak, the second-highest peak of the responsivity spectra is centered at 1560 nm with a broad spectral range that covers the conventional telecommunication S-, C-, L- and U-band, which matches the simulated QE spectrum. The small difference (30 nm shift) between the simulation and experimental results might be due to variation introduced during the device fabrication. The results show that the designed GSOI RCE PD 1300 resonant at both the 2000 nm and 1550 nm bands have been achieved.

Figures 17B, 17C:
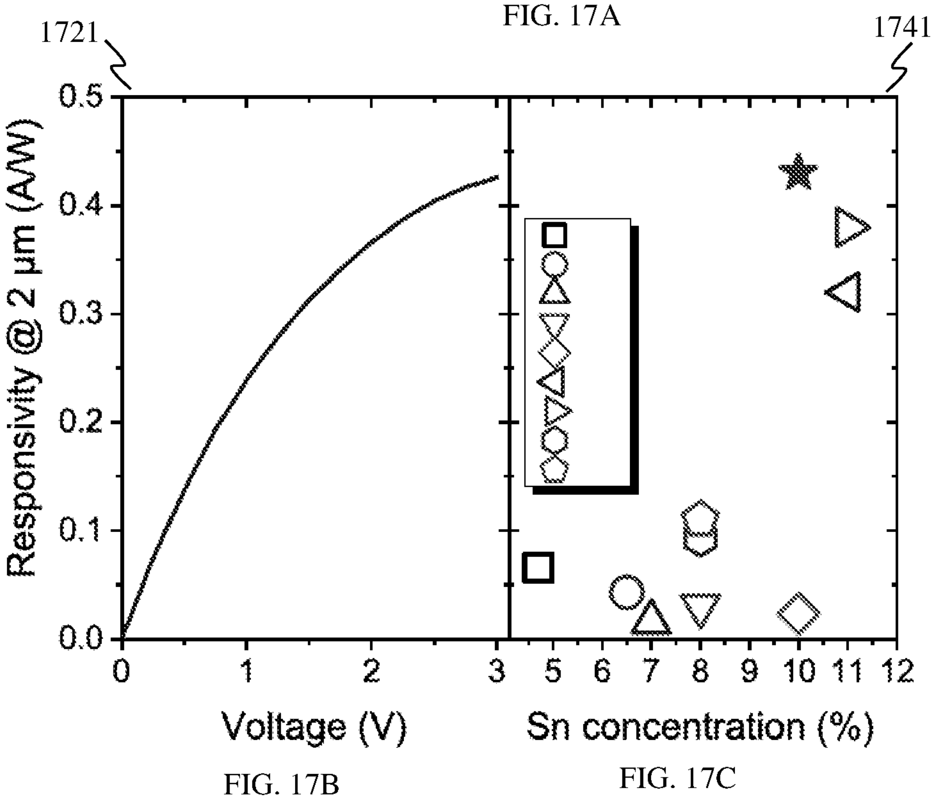
FIG. 17B shows a graph illustrating measured responsivity versus bias voltage with 2000 nm wavelength illumination, according to one example.
FIG. 17C shows a graph illustrating benchmark of responsivity at 2000 nm for GeSn photodetectors at room temperature, according to various examples.

Furthermore, the responsivity may be enhanced by increasing the bias voltage, as shown in a graph 1721 of FIG. 17B illustrating measured responsivity versus bias voltage with 2000 nm wavelength illumination. As bias voltage increases, the electric field in the devices is enhanced, resulting in the enhancement of carrier collection efficiency or gain. A responsivity of 0.43 A/W is observed at the bias voltage of 3 V at room temperature, which is among the highest responsivity of GeSn photodetectors at 2000 nm wavelength at room temperature, as shown in a graph 1741 of FIG. 17C illustrating benchmark of responsivity at 2000 nm for GeSn photodetectors at room temperature, where the different shaped symbols represent different existing photodetectors, and the solid star represents the designed GSOI RCE dual-waveband PD 1300). When the voltage is higher than 2.5 V, a saturation trend of the responsivity appears which is due to the Joule heating or minority carrier sweep-out effect.

The responsivity of MSM photoconductive detectors may be given by:—

$$R = \frac{q\eta(\mu_e + \mu_h)\tau_r}{hvl^2}V \qquad \text{Equation 18}$$

where h is the quantum efficiency, q is electron charge, hv is the energy of the incident photons. it, and un are the mobilities of electrons and holes, respectively. r, is the carrier lifetime.

With $\mu_e$=600 $cm^2$/Vs and $\mu_h$=300 $cm^2$/Vs, a linear fitting of the responsivity versus voltage in the range from 0 to 1 V (FIG. 17B) extracts the carrier lifetime of GeSn to be about 0.2 ns which is consistent with the reported values.

These experimental and simulation results demonstrate that it is promising to combine Sn alloying with a vertical resonant cavity in a high-quality GSOI platform to improve device performance, especially optical responsivity, of GeSn PDs. In addition, optimizing the device, such as surface passivation or Fermi level depinning, enhances the device's performance further. Considering the optical responsivity resonant peaks at multiple wavebands, tunable photodetection range, material quality engineering and 3D CMOS-compatible electronic-photonic integration, it is noted that the developed GeSn PDs are a promising candidate for efficient optical receivers on CMOS-compatible GSOI platform.

In summary, a GSOI dual-waveband RCE PD 1300 is designed, simulated and successfully achieved. The material is characterized by SIMS and spectral ellipsometry. The obtained dispersive optical constants are considered in the design and simulation of the device. A GSOI dual-waveband RCE PD resonating at both the 2000 nm and 1550 nm bands are designed by FDTD and fabricated by low temperature wafer-bonding, layer transfer and metallization. The introduction of Sn extends the detection wavelength range and the resonant cavity formed by the GeSn surface and the deposited $Al_2O_3$ layer enhance the optical responsivity, thus enabling effective photodetection at the 2000 nm and telecommunication bands. A novel route towards high-performance GeSn PDs operating in both the 2000 nm and telecommunication S-, C-, L- and U-bands for various applications is presented.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A photodiode detector comprising:

an optical cavity comprising an overlying light-receiving portion and an underlying mirror;

a GeSn absorption layer;

a multiplier layer disposed adjacent to the GeSn absorption layer;

a charge sheet layer thermally annealed to the multiplier layer, the charge sheet layer being doped with ion implantation with boron acceptors and having a doping concentration; and a n-doped layer with the underlying mirror buried thereunder, wherein the GeSn absorption layer is disposed within the optical cavity and arranged between the overlying light-receiving portion and the multiplier layer, the charge sheet layer is arranged between the GeSn absorption layer and the multiplier layer, the multiplier layer is arranged between the charge sheet layer and the heavily n-doped layer, the overlying light-receiving portion is configured to receive light to be detected by the photodiode detector, the optical cavity is configured to confine the received light in the GeSn absorption layer in a form of a standing wave propagating between the overlying light-receiving portion and the underlying mirror along a longitudinal axis of the optical cavity, and the photodiode detector has a triggering probability configured to be enhanced based on the doping concentration of the charge sheet layer.

2. The photodiode detector as claimed in claim 1, wherein the overlying light-receiving portion is a surface of the GeSn absorption layer, and the underlying mirror has a refractive index different from a refractive index of the GeSn absorption layer surface.

3. The photodiode detector as claimed in claim 1, wherein the photodiode detector is an avalanche photodiode detector; and/or wherein the photodiode detector further comprises a substrate having a planar surface, the optical cavity being arranged extending upwardly from the planar surface, with the underlying mirror being adjacent to the substrate or with the substrate forming an integrated part of the underlying mirror.

4. The photodiode detector as claimed in claim 1, wherein the underlying mirror is a distributed Bragg reflector, and the overlying light-receiving portion comprises a passivation layer.

5. The photodiode detector as claimed in claim 4, wherein the distributed Bragg reflector comprises a dielectric distributed Bragg reflector or a semiconductor distributed Bragg reflector.

6. The photodiode detector as claimed in claim 1, wherein the underlying mirror is a first distributed Bragg reflector, and the overlying light-receiving portion is a second distributed Bragg reflector.

7. The photodiode detector as claimed in claim 6, wherein the first distributed Bragg reflector and the second distributed Bragg reflector comprise one of the following:

same number of material pairs; or different numbers of material pairs; or same type of material pairs; or different types of material pairs.

8. The photodiode detector as claimed in claim 6, wherein each of the first distributed Bragg reflector and the second distributed Bragg reflector comprises a dielectric distributed Bragg reflector or a semiconductor distributed Bragg reflector.

9. The photodiode detector as claimed in claim 1, wherein the multiplier layer comprises a Si multiplier layer; and/or wherein an anode of the photodiode detector comprises a first metal contact for external electrical connection, the first metal contact overlying at least part of a positively doped p region of the GeSn absorption layer; and a cathode of the photodiode detector comprises a second metal contact for external electrical connection, the second metal contact overlying at least part of the n-doped layer.

10. The photodiode detector as claimed in claim 1, wherein the GeSn absorption layer has at least one of the following:

a Sn content of near 0% to about 11%; or a thickness of more than 100 nm.

11. The photodiode detector as claimed in claim 10, wherein the GeSn absorption layer has the Sn content of about 3% to 4% to enhance absorption coefficient at a wavelength of 1550 nm, or about 10% to enhance absorption coefficient at a wavelength of 2000 nm.

12. The photodiode detector as claimed in claim 1, wherein the underlying mirror has a thickness sufficient to provide about 0.5 reflectivity or more at a wavelength of 1550 nm or 2000 nm.

13. A method of fabricating a photodiode detector, the method comprising:

forming a first wafer comprising an underlying mirror;

growing a multiplier layer over a n-doped layer buried with the underlying mirror using reduced pressure chemical vapour deposition;

after growing the multiplier layer, doping a charge sheet layer with ion implantation with boron acceptors to form the charge sheet layer having a doping concentration;

performing rapid thermal annealing of the charge sheet layer and the multiplier layer;

forming a GeSn absorption layer over the first wafer; and forming an overlying light-receiving portion over the GeSn absorption layer, wherein the photodiode detector comprises an optical cavity including the overlying light-receiving portion and the underlying mirror, such that when in use, the overlying light-receiving portion receives light to be detected by the photodiode detector, and the optical cavity confines the received light in the GeSn absorption layer in a form of a standing wave propagating between the overlying light-receiving portion and the underlying mirror along a longitudinal axis of the optical cavity, and wherein the photodiode detector has a triggering probability enhanced based on the doping concentration of the charge sheet layer.

14. The method as claimed in claim 13, wherein the step of forming the GeSn absorption layer over the first wafer comprises one of the following:

(a) forming a second wafer comprising the GeSn absorption layer; and wafer-bonding the first wafer and the second wafer, wherein the GeSn absorption layer on the second wafer is facing toward the first wafer; or (b) growing the GeSn absorption layer and a p++ GeSn top contact layer over the first wafer using reduced pressure chemical vapour deposition.

15. The method as claimed in claim 14, wherein the step of forming the second wafer comprises depositing the GeSn absorption layer over a temporary substrate; and wherein after wafer-bonding, the method further comprises removing the temporary substrate by grinding and/or wet etching; and chemical mechanical polishing the GeSn absorption layer.

16. The method as claimed in claim 15, further comprising after chemical mechanical polishing the GeSn absorption layer, preparing the overlying light-receiving layer via ion-implantation.

17. The method as claimed in claim 14, further comprising prior to the step of wafer-bonding, atomic layer depositing a semiconductor material on the first wafer and the second wafer.

18. The method as claimed in claim 13, further comprising at least one of the following:

prior to the step of forming the first wafer, fabricating the n-doped layer buried with the underlying mirror using a double-SOI process; or after forming the overlying light-receiving portion over the GeSn absorption layer, forming two metal contacts for external electrical connections of the photodiode detector, using a metal deposition process, or a process comprising photolithography, electron-beam deposition, and subsequent lift-off process.

19. The method as claimed in claim 18, further comprising prior to the step of forming the two metal contacts, patterning a mesa on at least portion of the photodiode detector.

* * * * *